(12) United States Patent
Park et al.

(10) Patent No.: US 12,727,188 B2
(45) Date of Patent: Sep. 1, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Beomjin Park, Suwon-si (KR); Myung Gil Kang, Suwon-si (KR); Dongwon Kim, Suwon-si (KR); Younggwon Kim, Suwon-si (KR); Sungkeun Lim, Suwon-si (KR); Soojin Jeong, Suwon-si (KR); Yuyeong Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 477 days.

(21) Appl. No.: 18/112,534

(22) Filed: Feb. 22, 2023

(65) Prior Publication Data

US 2023/0420552 A1 Dec. 28, 2023

(30) Foreign Application Priority Data

Jun. 24, 2022 (KR) ........................ 10-2022-0077788

(51) Int. Cl.

*H10D 30/43* (2025.01)
*H10D 30/67* (2025.01)
*H10D 62/10* (2025.01)
*H10D 64/23* (2025.01)

(52) U.S. Cl.

CPC ......... *H10D 30/43* (2025.01); *H10D 30/6735* (2025.01); *H10D 62/121* (2025.01); *H10D 64/258* (2025.01)

(58) Field of Classification Search

None

See application file for complete search history.

(56) References Cited

U.S. PATENT DOCUMENTS

| | | | | |
|---|---|---|---|---|
| 9,704,962 | B1 | 7/2017 | Pawlak | |
| 10,559,566 | B1 | 2/2020 | Lee et al. | |
| 10,700,064 | B1 | 6/2020 | Zhang et al. | |
| 11,289,573 | B2 | 3/2022 | Wu et al. | |
| 2015/0380410 | A1 | 12/2015 | Ching et al. | |
| 2020/0044087 | A1* | 2/2020 | Guha ................ | H10D 30/6217 |

(Continued)

*Primary Examiner* — Sarah K Salerno

(74) *Attorney, Agent, or Firm* — Morgan, Lewis & Bockius LLP

(57) ABSTRACT

A semiconductor device includes: a substrate that includes an active pattern; a channel pattern disposed on the active pattern, wherein the channel pattern includes a plurality of semiconductor patterns that are stacked on each other and spaced apart from each other; a source/drain pattern connected to the plurality of semiconductor patterns; a gate electrode disposed on the plurality of semiconductor patterns, the gate electrode extending in a first direction; a gate dielectric layer disposed between the plurality of semiconductor patterns and the gate electrode; and a lower dielectric pattern disposed between the active pattern and the gate dielectric layer, wherein the gate dielectric layer includes an interface layer and a high-k dielectric layer, wherein the interface layer covers the semiconductor patterns, wherein the high-k dielectric layer is disposed on the interface layer, and wherein a thickness of the lower dielectric pattern is greater than a thickness of the interface layer.

20 Claims, 34 Drawing Sheets

(56) References Cited

U.S. PATENT DOCUMENTS

2020/0105750 A1 4/2020 Xiao
2020/0335583 A1* 10/2020 Sun ...................... H10D 62/121
2021/0098634 A1* 4/2021 Chung ............... H10D 30/6735
2021/0305400 A1 9/2021 Hsu et al.
2022/0084830 A1 3/2022 Hsu et al.
2022/0084889 A1 3/2022 Lai et al.
2022/0392808 A1* 12/2022 Guler ................. H10D 84/0158
2023/0009077 A1* 1/2023 Liang ................... H10D 62/118
2023/0104520 A1* 4/2023 Kim ....................... H10B 51/30
365/30

* cited by examiner

M2
M2_I
AC
GC
AR1
SHC
AR2
BD2
100
DB
A
A'
B
B'
C
C'
D
D'
AC
BD4
GE
CB2
BD3
M1_R1
M1_I
BD1
M1_R2
M1
D1
D2
D3

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0077788 filed on Jun. 24, 2022 in the Korean Intellectual Property Office, the disclosure of which is incorporated by reference herein in its entirety.

TECHNICAL FIELD

The present inventive concept relates to a semiconductor device and a method of fabricating the same, and more particularly, to a semiconductor device including a field effect transistor and a method of fabricating the same.

DISCUSSION OF THE RELATED ART

Generally, a semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may result in deterioration of operating characteristics of the semiconductor device. Accordingly, various studies have been conducted about methods of fabricating semiconductor devices that have superior performances while overcoming limitations caused by increased integration of the semiconductor devices.

SUMMARY

An exemplary embodiment of the present inventive concept provide a semiconductor device with improved electrical properties.

An exemplary embodiment of the present inventive concept provide a method of fabricating a semiconductor device with improved electrical properties.

An object or effect of the present inventive concept is not limited to the mentioned above object or effect, and other objects or effects which have not been mentioned above will be clearly understood to those skilled in the art from the following description.

According to an exemplary embodiment of the present inventive concept, a semiconductor device includes: a substrate that includes an active pattern; a channel pattern disposed on the active pattern, wherein the channel pattern includes a plurality of semiconductor patterns that are stacked on each other and spaced apart from each other; a source/drain pattern connected to the plurality of semiconductor patterns; a gate electrode disposed on the plurality of semiconductor patterns, the gate electrode extending in a first direction; a gate dielectric layer disposed between the plurality of semiconductor patterns and the gate electrode; and a lower dielectric pattern disposed between the active pattern and the gate dielectric layer, wherein the gate dielectric layer includes an interface layer and a high-k dielectric layer, wherein the interface layer covers the semiconductor patterns, wherein the high-k dielectric layer is disposed on the interface layer, and wherein a thickness of the lower dielectric pattern is greater than a thickness of the interface layer.

According to an exemplary embodiment of the present inventive concept, a semiconductor device includes: a substrate that includes an active pattern; a channel pattern disposed on the active pattern, wherein the channel pattern includes a plurality of semiconductor patterns that are stacked on each other and spaced apart from each other; a source/drain pattern connected to the plurality of semiconductor patterns; a gate electrode that covers the plurality of semiconductor patterns; a gate dielectric layer disposed between the plurality of semiconductor patterns and the gate electrode; and a lower dielectric pattern disposed between the active pattern and the gate electrode, wherein the gate dielectric layer covers at least a portion of a top surface of the lower dielectric pattern, and wherein the lower dielectric pattern and the gate electrode are spaced apart from each with the gate dielectric layer disposed therebetween.

According to an exemplary embodiment of the present inventive concept, a semiconductor device includes: a substrate that includes an active region; a device isolation layer that defines an active pattern on the active region; a lower dielectric pattern disposed on the active pattern; a channel pattern disposed on the lower dielectric pattern; a source/drain pattern disposed on a first surface of the channel pattern, wherein the source/drain pattern penetrates the lower dielectric pattern; a gate electrode disposed on the channel pattern; a gate dielectric layer disposed between the gate electrode and the channel pattern; a gate spacer disposed on a sidewall of the gate electrode; a gate capping pattern disposed on the gate electrode; an interlayer dielectric layer disposed on the gate capping pattern; an active contact that penetrates the interlayer dielectric layer and is electrical connected with the source/drain pattern; a metal-semiconductor compound layer disposed between the active contact and the source/drain pattern; a gate contact that penetrates the interlayer dielectric layer and the gate capping pattern and is electrically connected with the gate electrode; a first metal layer disposed on the interlayer dielectric layer, wherein the first metal layer includes a power line and first wiring lines, wherein the first wiring lines are correspondingly electrically connected to the active contact and the gate contact; and a second metal layer disposed on the first metal layer, wherein the second metal layer includes second wiring lines electrically connected to the first metal layer, wherein the channel pattern includes a plurality of semiconductor patterns that are stacked in a second direction substantially perpendicular to a top surface of the substrate, wherein the gate dielectric layer includes an interface layer and a high-k dielectric layer, wherein the interface layer covers the semiconductor patterns, and the high-k dielectric layer is disposed on the interface layer, and wherein the lower dielectric pattern and the interface layer include different materials from each other.

DETAILED DESCRIPTION OF THE EMBODIMENTS

The following will now describe a semiconductor package according to an exemplary embodiment of the present inventive concept with reference to accompanying drawings.

Figure 1:
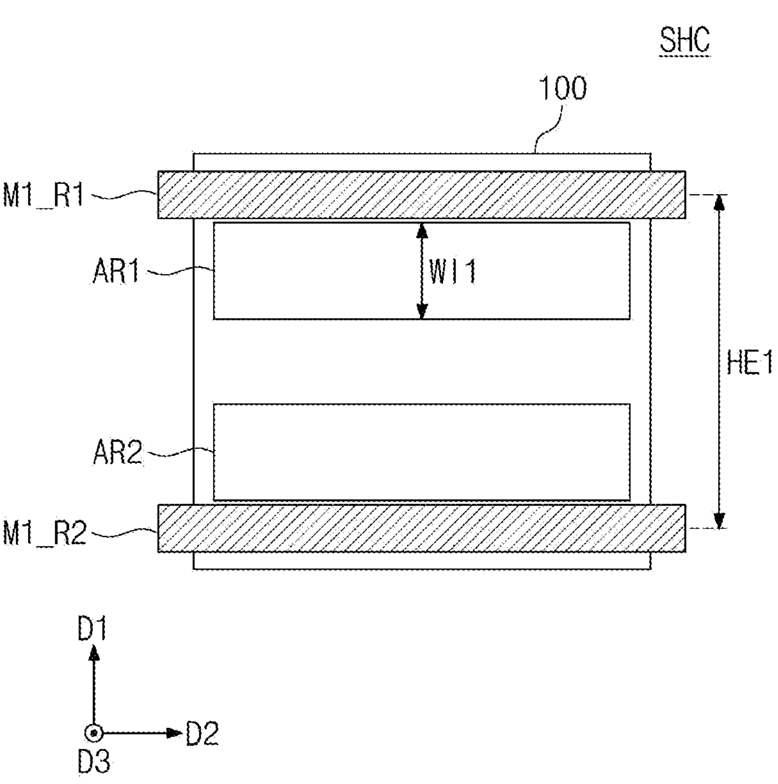
FIGS. 1, 2 and 3 illustrate views showing logic cells of a semiconductor device according to an exemplary embodiment of the present inventive concept.
Figure 2:
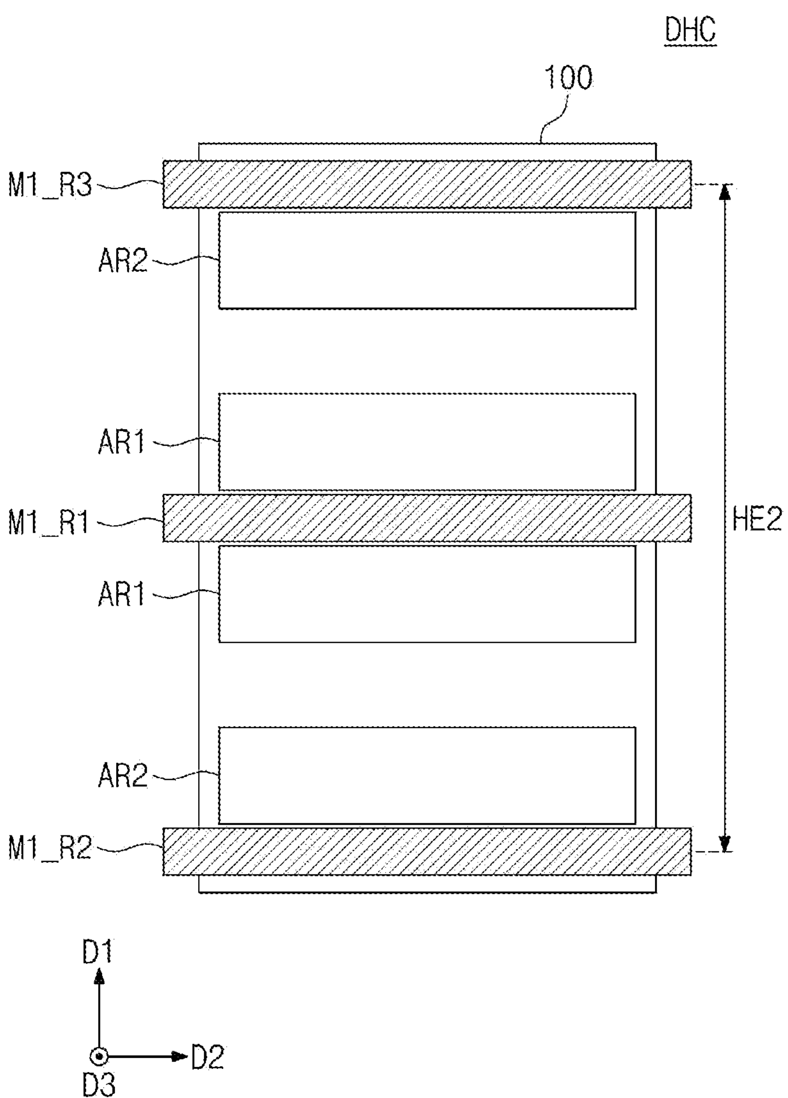
Figure 3:
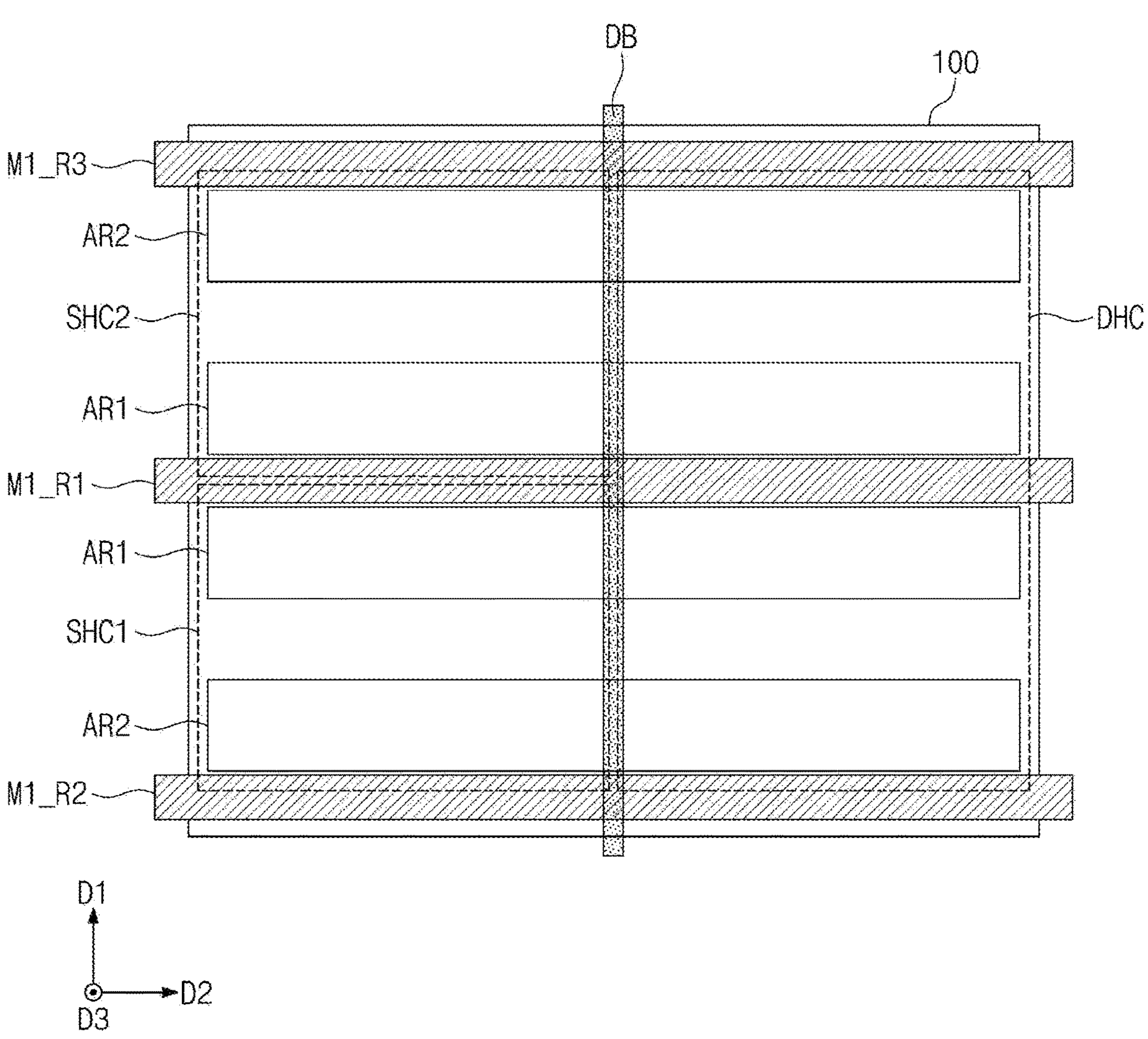

FIGS. 1 to 3 illustrate views showing logic cells of a semiconductor device according to an exemplary embodiment of the present inventive concept.

Referring to FIG. 1, a single height cell SHC may be provided. For example, a substrate 100 may be provided thereon with a first power line M1_R1 and a second power line M1_R2. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other of the first and second active regions AR1 and AR2 may be an NMOSFET region. For example, the single height cell SHC may have a complementary metal oxide semiconductor (CMOS) structure provided between the first power line M1_R1 and the second power line M1_R2.

Each of the first and second active regions AR1 and AR2 may have a first width WI1 in a first direction D1. A first height HE1 may indicate a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may be a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a drain voltage VDD.

The double height cell DHC may be between the second power line M1_R2 and the third power line M1_R3. The double height cell DHC may include two first active regions AR1 and two second active regions AR2.

One of the two second active regions AR2 may be adjacent to the second power line M1_R2. The other of the two second active regions AR2 may be adjacent to the third power line M1_R3. The two first active regions AR1 may be adjacent to the first power line M1_R1. When viewed in plan, the first power line M1_R1 may be disposed between the two first active regions AR1.

A second height HE2 may indicate a length in the first direction D1 of the double height cell DHC. The second height HE2 may be about twice the first height HE1 of FIG. 1. The two first active regions AR1 of the double height cell DHC may be integrally connected to each other to serve as one active region.

In an exemplary embodiment of the present inventive concept, the double height cell DHC shown in FIG. 2 may be a multi-height cell. The multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2. For example, the double height cell DHC may overlap the first power line M1_R1.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
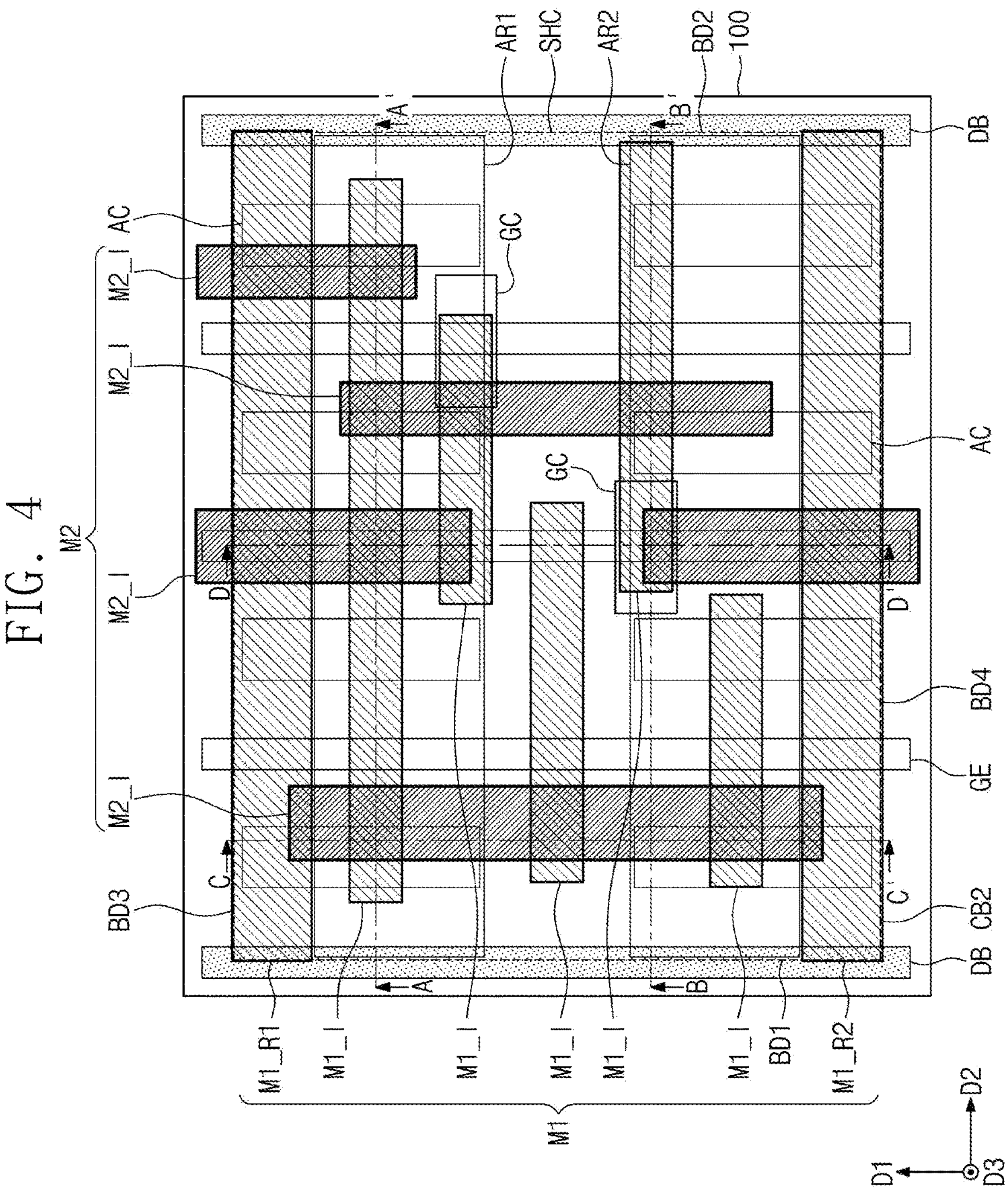
FIG. 4 illustrates a plan view showing a semiconductor device according to an exemplary embodiment of the present inventive concept.
Figure 5A:
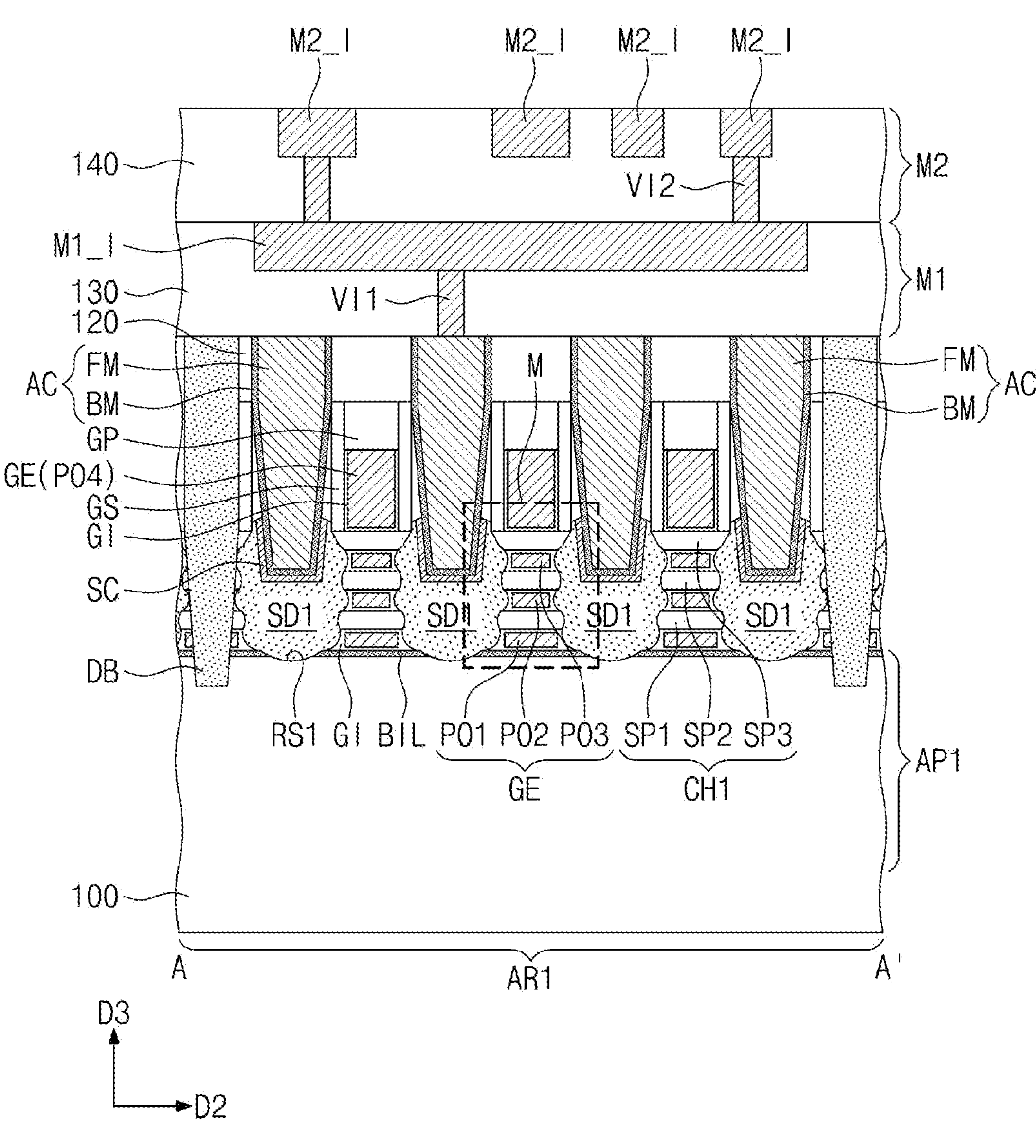
FIGS. 5A, 5B, 5C, and 5D illustrate cross-sectional views respectively taken along lines A-A', B-B', C-C', and D-D' of FIG. 4.
Figure 5B:
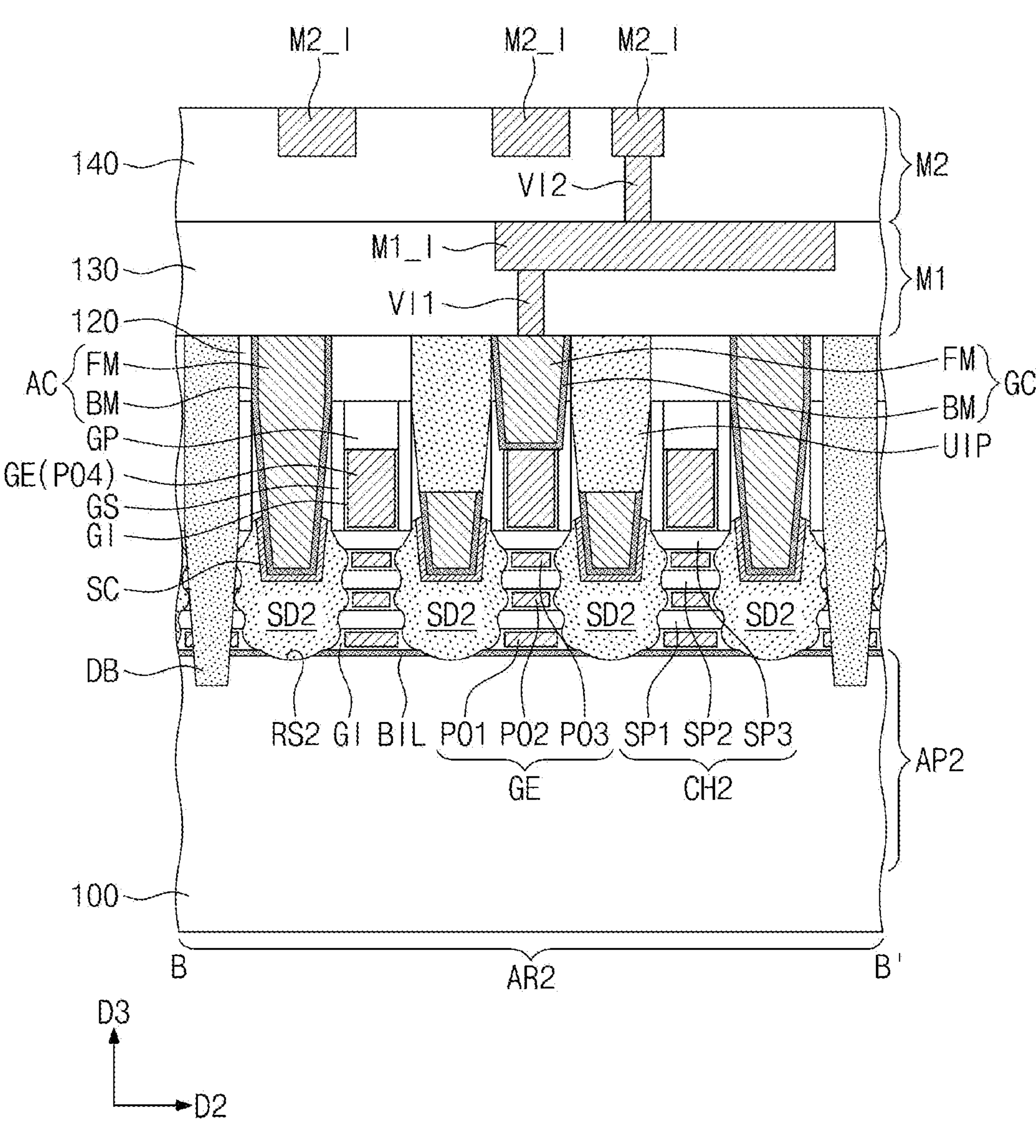
Figure 5C:
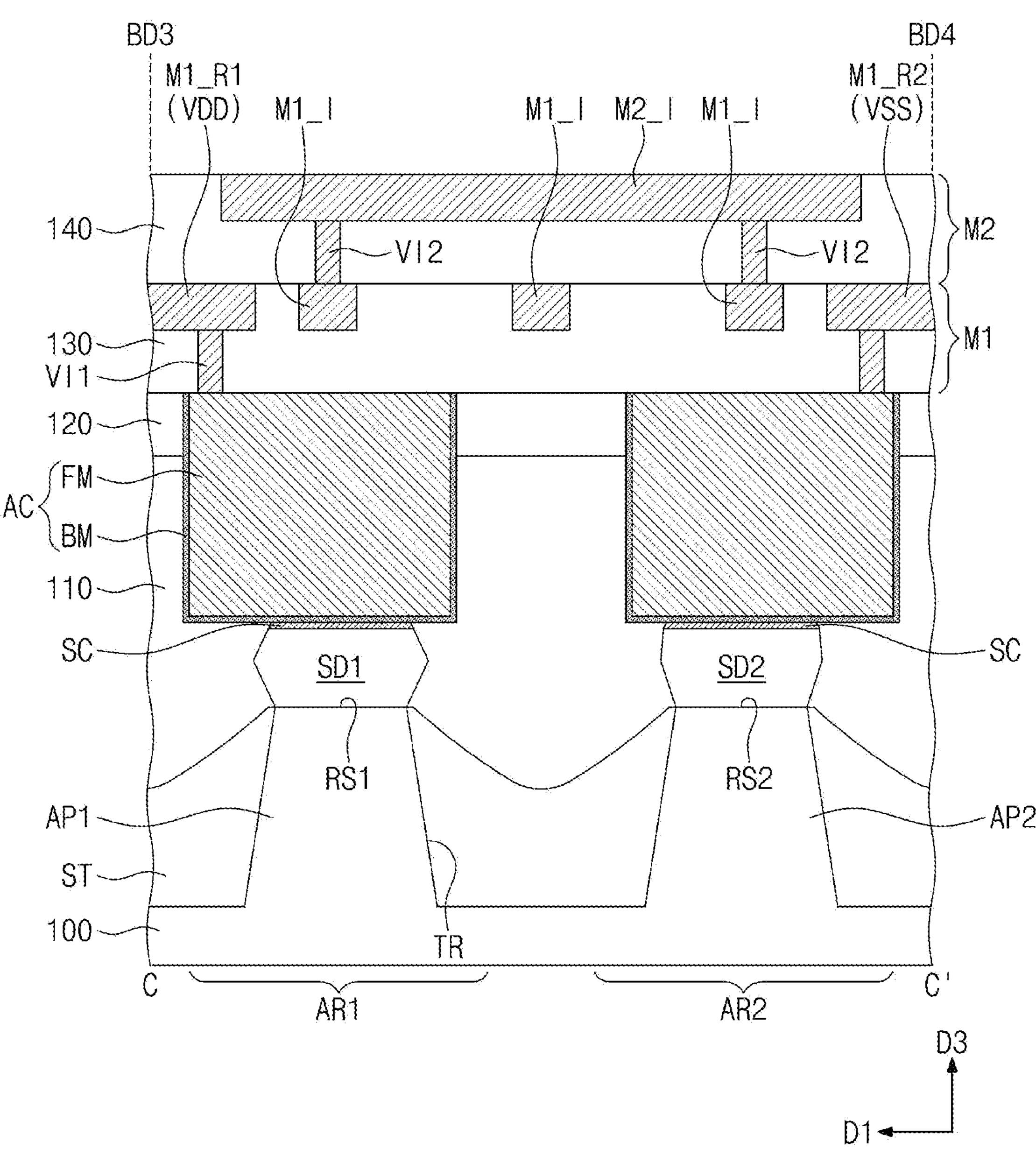

FIG. 4 illustrates a plan view showing a semiconductor device according to an exemplary embodiment of the present inventive concept. FIGS. 5A, 5B, 5C, and 5D illustrate cross-sectional views respectively taken along lines A-A', B-B', C-C', and D-D' of FIG. 4. FIG. 6A illustrates an enlarged view showing section M depicted in FIG. 5A according to an exemplary embodiment of the present inventive concept. FIG. 6B illustrates an enlarged view showing section N depicted in FIG. 5D according to an exemplary embodiment of the present inventive concept. A semiconductor device shown in FIGS. 4 and 5A to 5D is an example of the single height cell SHC depicted in FIG. 1.

Referring to FIGS. 4 and 5A to 5D, a single height cell SHC may be provided on a substrate 100. The single height cell SHC may be provided on the substrate 100 with logic transistors included in a logic circuit. The substrate 100 may be a compound semiconductor substrate or a semiconductor substrate including, for example, silicon, germanium, or silicon-germanium. For example, the substrate 100 may be a silicon substrate.

The substrate 100 may include a first active region AR1 and a second active region AR2. Each of the first and second active regions AR1 and AR2 may extend in a second direction D2. In an exemplary embodiment of the present inventive concept, the first active region AR1 may be a PMOSFET region, and the second active region AR2 may be an NMOSFET region.

A first active pattern AP1 and a second active pattern AP2 may be defined by a trench TR that is formed on an upper portion of the substrate 100. The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be vertically protruding portions of the substrate 100.

A device isolation layer ST may be provided on the substrate 100. The device isolation layer ST may fill the trench TR. The device isolation layer ST may include, for example, a silicon oxide layer. The device isolation layer ST might not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked on each other. The first, second, and third semiconductor patterns SP1, SP2, and SP3 may be spaced apart from each other in a vertical direction or a third direction D3.

Each of the first, second, and third semiconductor patterns SP1, SP2, and SP3 may include one or more of, for example, silicon (Si), germanium (Ge), and silicon-germanium (SiGe). For example, each of the first, second, and third semiconductor patterns SP1, SP2, and SP3 may include crystalline silicon.

A plurality of first source/drain patterns SD1 may be provided on the first active pattern AP1. A plurality of first recesses RS1 may be formed on an upper portion of the first active pattern AP1. The first source/drain patterns SD1 may be correspondingly provided in the first recesses RS1. The first source/drain patterns SD1 may be impurity regions of a first conductivity type (e.g., n-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recesses RS2 may be formed on an upper portion of the second active pattern AP2. The second source/drain patterns SD2 may be correspondingly provided in the second recesses RS2. The second source/drain patterns SD2 may be impurity regions of a second conductivity type (e.g., p-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth process. For example, each of the first and second source/drain patterns SD1 and SD2 may have a top surface higher than that of the third semiconductor pattern SP3. For another example, at least one of the first and second source/drain patterns SD1 and SD2 may have a top surface located at substantially the same level as that of a top surface of the third semiconductor pattern SP3.

In an exemplary embodiment of the present inventive concept, the first source/drain patterns SD1 may include the same semiconductor element (e.g., Si) as that of the substrate 100. The second source/drain patterns SD2 may include a semiconductor element (e.g., SiGe) whose lattice constant is greater than that of a semiconductor element of the substrate 100. Therefore, a pair of second source/drain patterns SD2 may provide a compressive stress to the second channel pattern CH2 therebetween.

Each of the first and second source/drain patterns SD1 and SD2 may have a sidewall having a rugged embossed shape. For example, each of the first and second source/drain patterns SD1 and SD2 may have a sidewall that is an uneven surface. For example, each of the first and second source/drain patterns SD1 and SD2 may have a sidewall with a wavelike profile. The sidewall of each of the first and second source/drain patterns SD1 and SD2 may protrude toward first, second, and third portions PO1, PO2, and PO3 of a gate electrode GE which will be discussed below.

A plurality of gate electrodes GE may be provided to extend in a first direction D1 and to extend across the first and second channel patterns CH1 and CH2. The gate electrodes GE may be arranged at a first pitch in the second direction D2. Each of the gate electrodes GE may vertically overlap the first and second channel patterns CH1 and CH2.

The gate electrode GE may include a first portion PO1 interposed between the first semiconductor pattern SP1 and the active pattern AP1 or AP2, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 disposed on the third semiconductor pattern SP3.

Figure 5D:
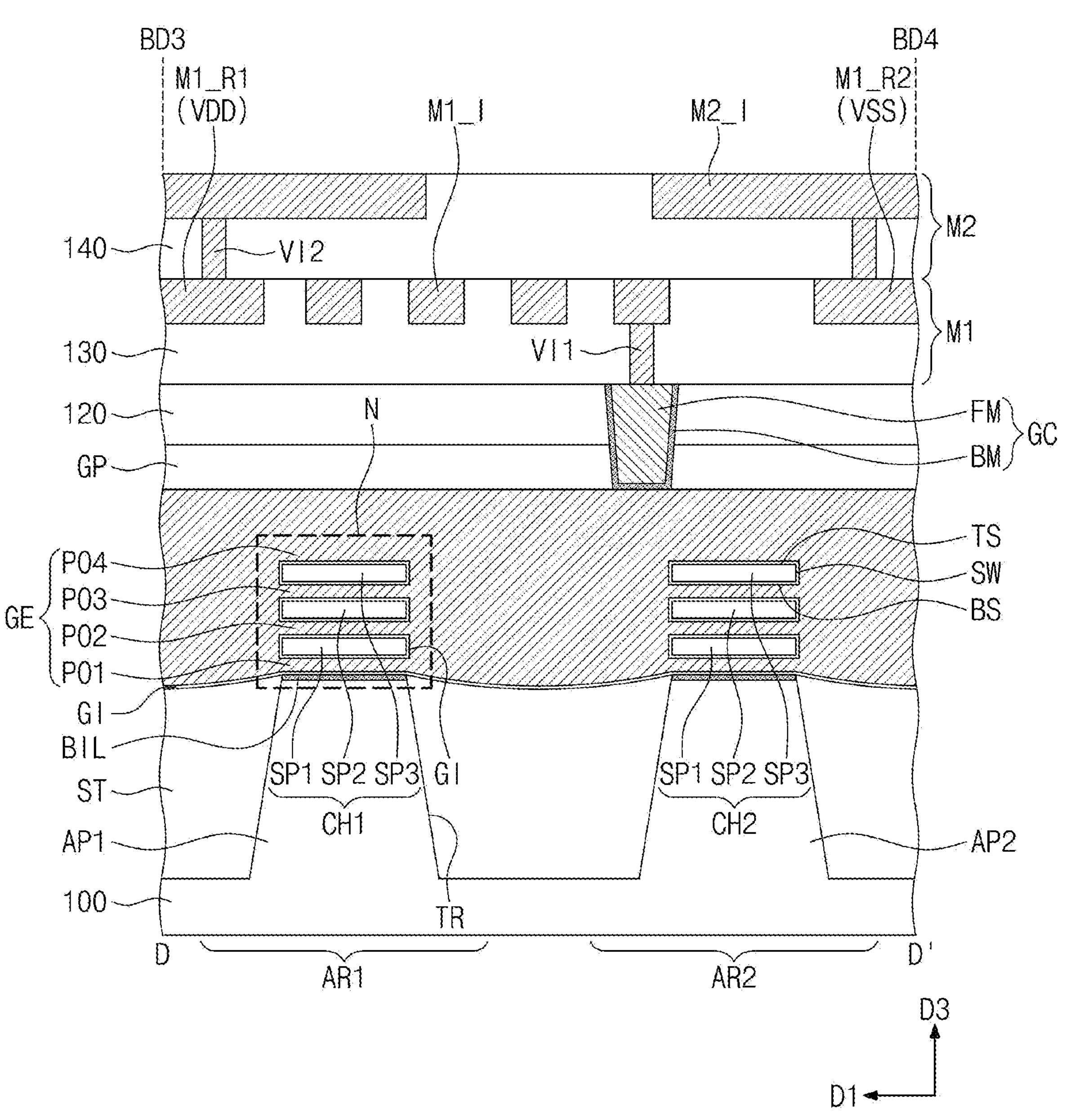
Figure 6A:
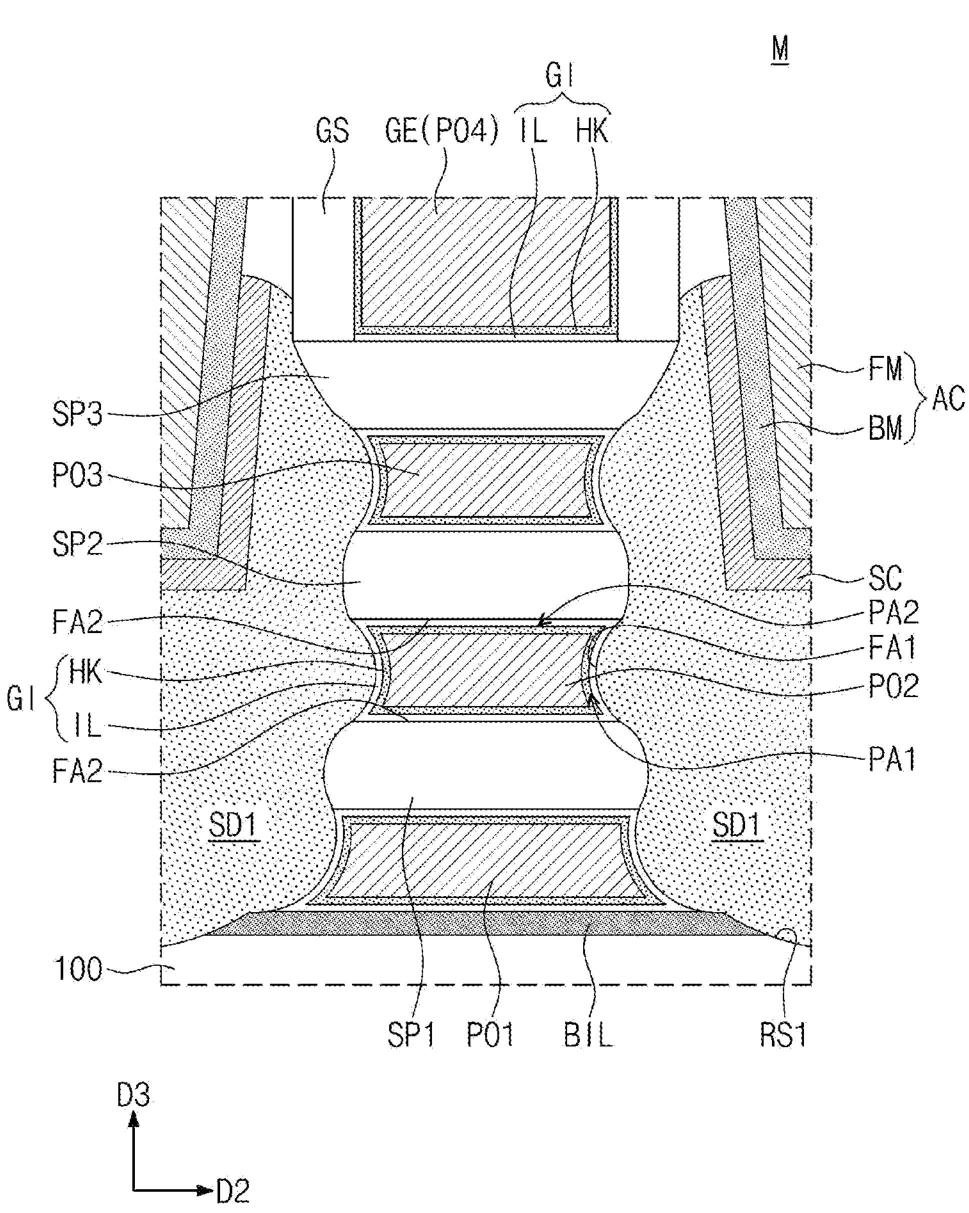
FIG. 6A illustrates an enlarged view showing section M depicted in FIG. 5A according to an exemplary embodiment of the present inventive concept.
Figure 6B:
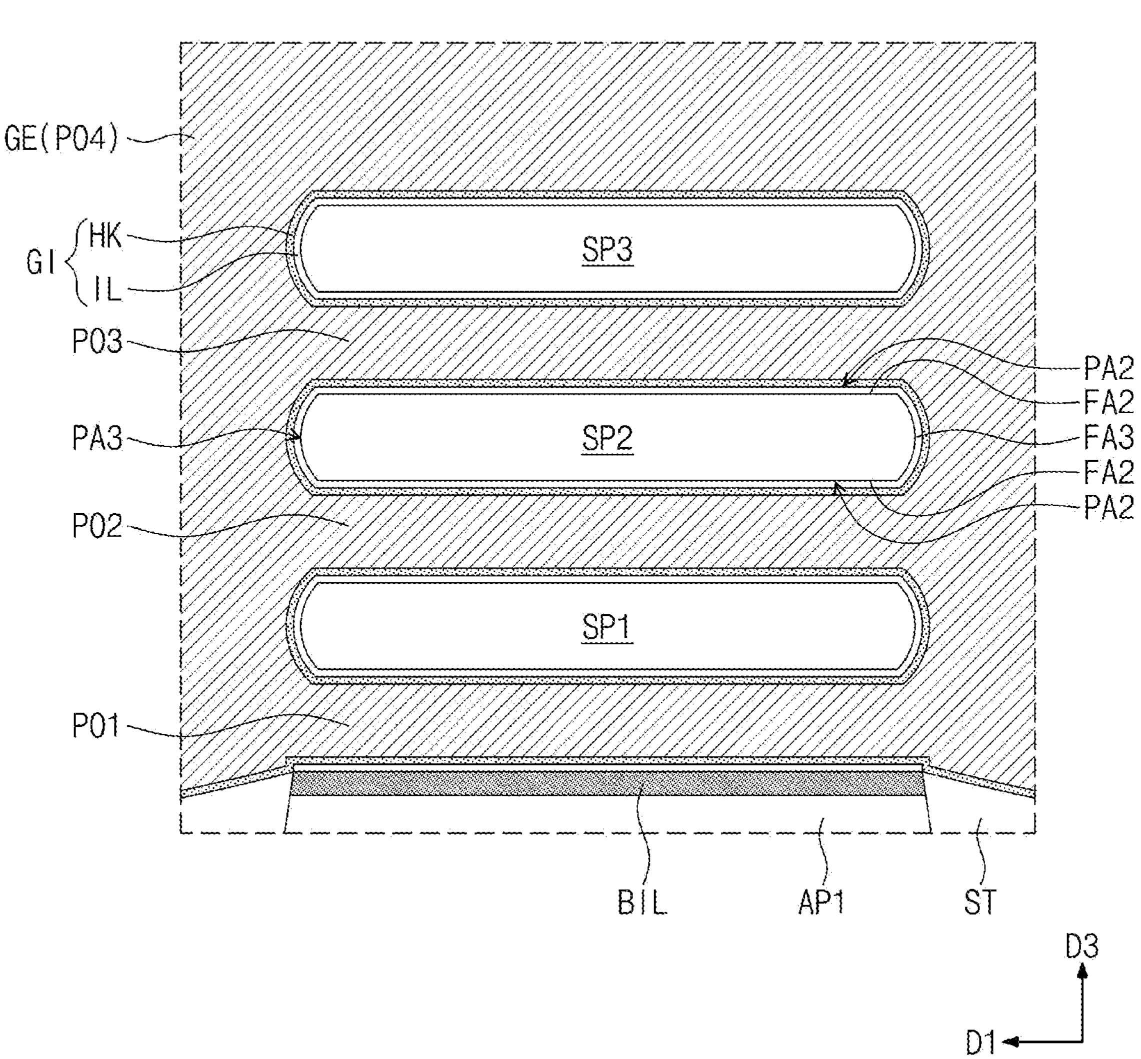
FIG. 6B illustrates an enlarged view showing section N depicted in FIG. 5D according to an exemplary embodiment of the present inventive concept.

Referring to FIG. 5D, the gate electrode GE may be provided on a top surface TS, a bottom surface BS, and opposite sidewalls SW of each of the first, second, and third semiconductor patterns SP1, SP2, and SP3. In this sense, a transistor according to the present embodiment may be a three-dimensional field effect transistor (e.g., MBCFET or GAAFET) in which the gate electrode GE three-dimensionally surrounds the first and second channel patterns CH1 and CH2.

Referring back to FIGS. 4 and 5A to 5D, a lower dielectric pattern BIL may be provided on the first and second active patterns AP1 and AP2. The lower dielectric pattern BIL may be interposed between the first active pattern AP1 and the first portion PO1 of the gate electrode GE. The lower dielectric pattern BIL may be interposed between the second active pattern AP2 and the first portion PO1 of the gate electrode GE.

A pair of gate spacers GS may be disposed on opposite sidewalls of the fourth portion PO4 of the gate electrodes GE. The gate spacers GS may extend in the first direction D1 along the gate electrode GE. The gate spacers GS may have their top surfaces higher than that of the gate electrode GE. The top surfaces of the gate spacers GS may be substantially coplanar with that of a first interlayer dielectric layer 110 which will be discussed below. In an exemplary embodiment of the present inventive concept, the gate spacers GS may include at least one of SiCN, SiCON, and/or SiN. In an exemplary embodiment of the present inventive concept, the gate spacers GS may include a multi-layer formed of at least two of SiCN, SiCON, and/or SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one of, for example, SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may be disposed between the gate electrode GE and gate spacer GS. The gate dielectric layer GI may cover the top surface TS, the bottom surface BS, and the opposite sidewalls SW of each of the first, second, and third semiconductor patterns SP1, SP2, and SP3. The gate dielectric layer GI may cover a top surface of the device isolation layer ST that is below the gate electrode GE. The gate dielectric layer GI may be interposed between the lower dielectric pattern BIL and the first portion PO1 of the gate electrode GE. The gate dielectric layer GI may cover a top surface of the lower dielectric pattern BIL.

In an exemplary embodiment of the present inventive concept, referring to FIGS. 6A and 6B, the gate dielectric layer GI may include an interface layer IL and a high-k dielectric layer HK. The interface layer IL may include at least one of, for example, a silicon oxide layer and/or a silicon nitride layer. The high-k dielectric layer HK may include a high-k dielectric material whose dielectric constant is greater than that of a silicon oxide layer. For example, the high-k dielectric layer HK may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In an exemplary embodiment of the present inventive concept, a semiconductor device may include a negative capacitance field effect transistor that uses a negative capacitor. For example, the gate dielectric layer GI may include a ferroelectric material layer, which exhibits ferroelectric properties, and a paraelectric material layer, which exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In addition, when at least one of two or more capacitors that are connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing (SS) of less than about 60 mV/decade at about room temperature.

The ferroelectric material layer may have ferroelectric properties. The ferroelectric material layer may include, for example, at least one of hafnium oxide, hafnium zirconium oxide, barium strontium titanium oxide, and/or lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one impurity such as gadolinium (Gd), silicon (Si), zirconium (Zr), aluminum (Al), and yttrium (Y).

When the impurities are aluminum (Al), the ferroelectric material layer may include about 3 to 8 atomic percent of aluminum. In this description, the ratio of impurities may be a ratio of aluminum to the sum of hafnium and aluminum.

When the impurities are silicon (Si), the ferroelectric material layer may include about 2 to about 10 atomic percent of silicon. When the impurities are yttrium (Y), the ferroelectric material layer may include about 2 to about 10 atomic percent of yttrium. When the impurities are gadolinium (Gd), the ferroelectric material layer may include about 1 to about 7 atomic percent of gadolinium. When the impurities are zirconium (Zr), the ferroelectric material layer may include about 50 to 80 atomic percent of zirconium.

The paraelectric material layer may have paraelectric properties. The paraelectric material layer may include, for example, at least one of silicon oxide and high-k metal oxide. The metal oxide included in the paraelectric material layer may include, for example, at least one of hafnium oxide, zirconium oxide, and aluminum oxide, but the present inventive concept is not limited thereto.

The ferroelectric and paraelectric material layers may include the same material as each other. The ferroelectric material layer may have ferroelectric properties, but the paraelectric material layer might not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concept is not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

Referring back to FIGS. 4 and 5A to 5D, the gate electrode GE may include a first metal pattern and a second metal pattern disposed on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third portions PO1, PO2, and PO3 of the gate electrode GE may be formed of the first metal pattern or a work-function metal.

The first metal pattern may include a metal nitride layer. For example, the first metal pattern may include nitrogen (N) and at least one of titanium (Ti), tantalum (Ta), aluminum (Al), tungsten (W), and/or molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one of tungsten (W), aluminum (Al), titanium (Ti), and/or tantalum (Ta). For example, the fourth portion PO4 of the gate electrode GE may include a first metal pattern and a second metal pattern disposed on the first metal pattern.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. A second interlayer dielectric layer 120 may be provided on the first interlayer dielectric layer 110 and may cover the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

The single height cell SHC may have a first boundary BD1 and a second boundary BD2 that are opposite to each other in the second direction D2. The first and second boundaries BD1 and BD2 may extend in the first direction D1. The single height cell SHC may have a third boundary BD3 and a fourth boundary BD4 that are opposite to each other in the first direction D1. The third and fourth boundaries BD3 and BD4 may extend in the second direction D2.

The single height cell SHC may be provided with a pair of separation structures DB that are on opposing sides of the single height cell SHC and are opposite to each other in the second direction D2. For example, the pair of separation structures DB may be correspondingly provided on first and second boundaries BD1 and BD2 of the single height cell SHC. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120 to extend into the first and second active patterns AP1 and AP2. The separation structure DB may penetrate the upper portion of each of the first and second active patterns AP1 and AP2. The separation structure DB may electrically separate an active region of the single height cell SHC from an active region of another cell that is adjacent thereto.

Active contacts AC may be provided to penetrate the first and second interlayer dielectric layers 110 and 120 and to correspondingly electrically connect to the first and second source/drain patterns SD1 and SD2. A pair of active contacts AC may be provided on opposite sides of the gate electrode GE. When viewed in plan, the active contact AC may have a bar shape or a polygonal shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. The active contact AC may cover at least a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contacts AC may be electrically connected through the metal-semiconductor compound layers SC to the first and second source/drain patterns SD1 and SD2. For example, the metal-semiconductor compound layer SC may include at least one of titanium silicide, tantalum silicide, tungsten silicide, nickel silicide, and/or cobalt silicide.

Gate contacts GC may be provided to penetrate the second interlayer dielectric layer 120 and the gate capping pattern GP to come into electrical connection with corresponding gate electrodes GE. When viewed in plan, the gate contacts GC may be disposed to correspondingly overlap the first active region AR1 and the second active region AR2. For example, the gate contact GC may be provided on the second active pattern AP2 (see FIG. 5B).

In an exemplary embodiment of the present inventive concept, referring to FIG. 5B, an upper dielectric pattern UIP may fill an upper portion of the active contact AC, and the upper portion is adjacent to the gate contact GC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to prevent an electrical short resulting from contact between the gate contact GC and its adjacent active contact AC (e.g., the active contacts AC most adjacent to the gate contact GC).

Each of the active contact AC and the gate contact GC may include a conductive pattern FM and a barrier pattern BM that at least partially surrounds the conductive pattern FM. For example, the conductive pattern FM may include at least one of aluminum, copper, tungsten, molybdenum, and/or cobalt. The barrier pattern BM may cover sidewalls and a bottom surface of the conductive pattern FM. The barrier pattern BM may include a double layer; however, the present inventive concept is not limited thereto. For example, the barrier pattern BM may include a metal layer and a metal nitride layer. The metal layer may include at least one of, for example, titanium, tantalum, tungsten, nickel, cobalt, and/or platinum. The metal nitride layer may include at least one of, for example, a titanium nitride (TiN) layer, a tantalum nitride (TaN) layer, a tungsten nitride (WN) layer, a nickel nitride (NiN) layer, a cobalt nitride (CoN) layer, and/or a platinum nitride (PtN) layer.

A first metal layer M1 may be provided in the third interlayer dielectric layer 130. For example, the first metal layer M1 may include a first power line M1_R1, a second power line M1_R2, and first wiring lines M1_1. Each of the lines M1_R1, M1_R2, and M1_I of the first metal layer M1 may extend parallel to each other in the second direction D2.

For example, the first and second power lines M1_R1 and M1_R2 may be respectively provided on the third and fourth boundaries BD3 and BD4 of the single height cell SHC. The first power line M1_R1 may extend in the second direction D2 along the third boundary BD3. The second power line M1_R2 may extend in the second direction D2 along the fourth boundary BD4.

The first wiring lines M1_I may be disposed between the first and second power lines M1_R1 and M1_R2 of the first metal layer M1. The first wiring lines M1_I of the first metal layer M1 may be arranged at a second pitch along the first direction D1. The second pitch may be less than the first pitch. Each of the first wiring lines M1_I may have a line-width less than that of each of the first and second power lines M1_R1 and M1_R2.

The first metal layer M1 may further include first vias VI1. The first vias VI1 may be correspondingly provided below the lines M1_R1, M1_R2, and M1_I of the first metal layer M1. The first via VI1 may electrically connect the active contact AC to one of the lines M1_R1, M1_R2, and M1_I of the first metal layer M1. The first via VI1 may electrically connect the gate contact GC to one of the lines M1_R1, M1_R2, and M1_I of the first metal layer M1.

A wiring line and its underlying first via VI1 of the first metal layer M1 may be formed by individual processes. For example, a wiring line and its underlying first via VI1 of the first metal layer M1 may each be formed by a single damascene process. For example, a sub-20 nm process may be employed to fabricate a semiconductor device according to the present embodiment.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may extend parallel to each other in the first direction D1.

The second metal layer M2 may further include second vias VI2 correspondingly provided below the second wiring lines M2_I. A wiring line of the first metal layer M1 may be electrically connected to a corresponding wiring line (e.g., a second wiring line M2_I) of the second metal layer M2 through the second via VI2. For example, a second wiring line M2_I and its underlying second via VI2 of the second metal layer M2 may be simultaneously formed by a dual damascene process.

The first and second metal layers M1 and M2 may have their wiring lines that include the same or different conductive materials from each other. For example, the first and second metal layers M1 and M2 may have their wiring lines that include at least one metallic material, such as aluminum, copper, tungsten, molybdenum, ruthenium, and cobalt. Other metal layers (e.g., M3, M4, M5, etc.) may be additionally stacked on the fourth interlayer dielectric layer 140. Each of the stacked metal layers may include wiring lines for routing between cells.

The gate dielectric layer GI will be further discussed in detail with reference to FIGS. 6A and 6B. Referring to FIGS. 6A, each of the first, second, and third portions PO1, PO2, and PO3 of the gate electrode GE may have a concave sidewall. The concave sidewall of each of the first, second, and third portions PO, PO2, and PO3 may correspond to a protruding sidewall of the first source/drain pattern SD1. For example, the protruding sidewall of the first source/drain pattern SD1 may have a convex shape.

In an exemplary embodiment of the present inventive concept, the first, second, and third portions PO1, PO2, and PO3 may have different widths from each other. For example, a maximum width in the second direction D2 of the third portion PO3 may be greater than a maximum width in the second direction D2 of the second portion PO2. A maximum width in the second direction D2 of the first portion PO1 may be greater than the maximum in the second direction D2 of the third portion PO3. However, the present inventive concept is not limited thereto. For example, the maximum width in the second direction D2 of the third portion PO3 may be equal to the maximum width in the second direction D2 of the second portion PO2.

The following will representatively describe the second portion PO2 of the gage electrode GE and the gate dielectric layer GI that surrounds the second portion PO2. The gate dielectric layer GI may be interposed between the second portion PO2 and the first semiconductor pattern SP1, between the second portion PO2 and the second semiconductor pattern SP2, and between the second portion PO2 and the first source/drain pattern SD1.

The gate dielectric layer GI may include an interface layer IL and a high-k dielectric layer HK. The interface layer IL may cover or overlap with the first semiconductor pattern SP1, the second semiconductor pattern SP2, and the first source/drain pattern SD1. For example, the interface layer IL may at least partially surround the second portion PO2. The high-k dielectric layer HK may be interposed between the interface layer IL and the second portion PO2. The high-k dielectric layer HK may cover a surface of the second portion PO2.

The high-k dielectric layer HK may have a substantially uniform thickness. A thickness in a horizontal direction of the interface layer IL may be greater than a thickness in a vertical direction of the interface layer IL. The present inventive concept, however, is not limited thereto, and the interface layer IL may have a substantially uniform thickness. The interface layer IL may have a thickness ranging from about 5 Å to about 8 Å.

A first part PA1 of the gate dielectric layer GI may be provided on a first facet FA1 of the first source/drain pattern SD1. The first facet FA1 of the first source/drain pattern SD1 may be a crystal plane having a normal line in the second direction D2. For example, the first facet FA1 may be a {110} crystal plane.

A second part PA2 of the gate dielectric layer GI may be provided on a second facet FA2 of each of the first and second semiconductor patterns SP1 and SP2. The second facet FA2 may be one of top and bottom surfaces of each of the first and second semiconductor patterns SP1 and SP2. The second facet FA2 may be a crystal plane having a normal line in the third direction D3. For example, the second facet FA2 may be a {100} crystal plane.

Referring to FIG. 6B, the first active pattern AP1 may be provided on the substrate 100 with the first, second, and third semiconductor patterns SP1, SP2, and SP3 that are vertically stacked and spaced apart from each other. The gate dielectric layer GI may surround each of the first, second, and third semiconductor patterns SP1, SP2, and SP3. For example, the gate dielectric layer GI may completely surround each of the first, second and third semiconductor patterns SP1, SP2, and SP3. The following will representatively describe the second semiconductor pattern SP2 and the gate dielectric layer GI that surrounds the second semiconductor pattern SP2.

The gate dielectric layer GI may include a third part PA3 on a sidewall of the second semiconductor pattern SP2, for example, on a third facet FA3 of the second semiconductor pattern SP2. The gate dielectric layer GI may include a second part PA2 on a top surface and/or a bottom surface of the second semiconductor pattern SP2, for example, on a second facet FA2 of the second semiconductor pattern SP2.

The third facet FA3 may be a crystal plane having a normal line in the first direction D1. For example, the third facet FA3 may be a {110} crystal plane. The second facet FA2 may be a crystal plane having a normal line in the third direction D3. For example, the second facet FA2 may be a {100} crystal plane.

FIGS. 6A and 6B depict by way of example the gate dielectric layer GI on the first channel pattern CH1. In an exemplary embodiment of the present inventive concept, not only the first channel pattern CH1 but also the second channel pattern CH2 may have the same properties as those discussed with reference to FIGS. 6A and 6B.

The lower dielectric pattern BIL will be described in detail below with reference to FIGS. 5A, 5D, 6A, and 6B. On the first active pattern AP1, the lower dielectric pattern BIL may be cut or penetrated by the first source/drain patterns SD1 and the separation structure DB. The lower dielectric pattern BIL may be arranged along the second direction D2 on the first active pattern AP1. On the second active pattern AP2, the lower dielectric pattern BIL may be cut or penetrated by the second source/drain patterns SD2 and the separation structure DB. The lower dielectric pattern BIL may be arranged along the second direction D2 on the second active pattern AP2. For example, the separation structure DB and the first and second source/drain patterns SD1 and SD2 may penetrate the lower dielectric pattern BIL. The lower dielectric pattern BIL may be in contact with the first and second source/drain patterns SD1 and SD2.

The lower dielectric pattern BIL may be interposed between the first active pattern AP1 and a lowermost portion of the gate dielectric layer GI. The lower dielectric pattern BIL may be interposed between the second active pattern AP2 and a lowermost portion of the gate dielectric layer GI. On the first active pattern AP1, a bottom surface of the lower dielectric pattern BIL may be in contact with a top surface of the first active pattern AP1. On the second active pattern AP2, a bottom surface of the lower dielectric pattern BIL may be in contact with a top surface of the second active pattern AP2. On the first active pattern AP1, a top surface of the lower dielectric pattern BIL may be in contact with a lowermost interface layer IL of the gate dielectric layer GI. The gate dielectric layer GI may cover at least a portion of the top surface of the lower dielectric pattern BIL. An uppermost surface of the lower dielectric pattern BIL may be located at a level lower than that of a lowermost surface of the gate electrode GE. A thickness of the lower dielectric pattern BIL may be greater than that of the interface layer IL. For example, the lower dielectric pattern BIL may have a thickness ranging from about 12 Å to about 30 Å.

A width in the second direction D2 of the lower dielectric pattern BIL may be greater than a width in the second direction D2 of the gate electrode GE. The width in the second direction D2 of the lower dielectric pattern BIL may be greater than a width in the second direction D2 of the gate dielectric layer GI. For example, the width in the second direction D2 of the lower dielectric pattern BIL may be greater than a width in the second direction D2 of the interface layer IL.

The lower dielectric pattern BIL and the gate electrode GE may be spaced apart in a vertical direction from each other across the gate dielectric layer GI. The high-k dielectric layer HK and the lower dielectric pattern BIL may be spaced apart in a vertical direction from each other across the interface layer IL. The first and second active patterns AP1 and AP2 and the gate dielectric layer GI may be spaced apart in a vertical direction from each other across the lower dielectric pattern BIL. The lower dielectric pattern BIL may overlap in a vertical direction with the first and second channel patterns CH1 and CH2, and might not overlap in a horizontal direction with any of the first and second channel patterns CH1 and CH2.

The lower dielectric pattern BIL may include a different material from that of the interface layer IL. According to an exemplary embodiment of the present inventive concept, the lower dielectric pattern BIL may include silicon-germanium oxide (SiGeOx). The lower dielectric pattern BIL may have a germanium concentration ranging from about 3 at % to about 15 at %. According to an exemplary embodiment of the present inventive concept, the lower dielectric pattern BIL may further include carbon (C). This configuration may be changed based on design of a semiconductor device which is intended to be implemented. The carbon may be present as an interstitial or substitutional atom in silicon-germanium oxide (SiGeOx).

According to an exemplary embodiment of the present inventive concept, the lower dielectric pattern BIL may be interposed between the first portion PO1 of the gate electrode GE and the first active pattern AP1 of the substrate 100 and may be interposed between the first portion PO1 of the gate electrode GE and the second active pattern AP2 of the substrate 100. Therefore, a distance between the gate electrode GE and the substrate 100 may be increased to reduce a capacitance between the gate electrode GE and the substrate 100. Accordingly, it may be possible to improve electrical properties of a semiconductor device according to an exemplary embodiment of the present inventive concept.

FIGS. 7A to 12C illustrate cross-sectional views showing a method of fabricating a semiconductor device according to an exemplary embodiment of the present inventive concept. FIGS. 7A, 8A, 9A, 10A, 11A, and 12A illustrate cross-sectional views taken along line A-A' of FIG. 4. FIGS. 9B, 10B, 11B, and 12B illustrate cross-sectional views taken along line C-C' of FIG. 4. FIGS. 7B, 8B, 9C, 10C, 11C, and 12C illustrate cross-sectional views taken along line D-D' of FIG. 4.

Figure 7A:
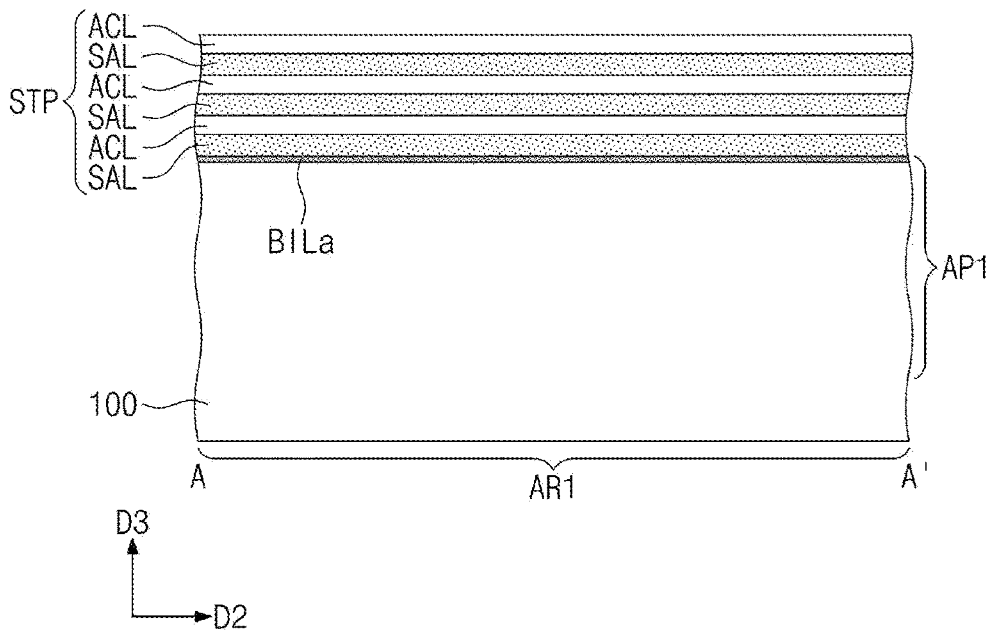
FIGS. 7A, 7B, 8A, 8B, 9A, 9B, 9C, 10A, 10B, 10C, 11A, 11B, 11C, 12A, 12B, and 12C illustrate cross-sectional views showing a method of fabricating a semiconductor device according to an exemplary embodiment of the present inventive concept.
Figure 7B:
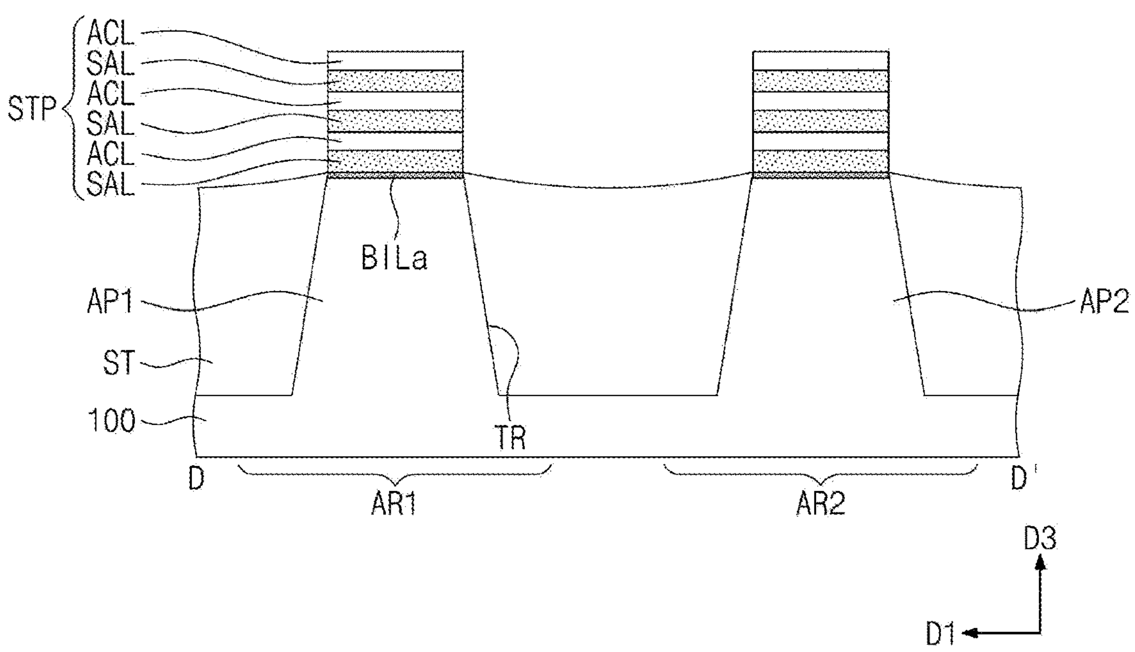

Referring to FIGS. 7A and 7B, a substrate 100 may be provided to include a first active region AR1 and a second active region AR2. A lower compound semiconductor layer BILa may be formed on the substrate 100. The lower compound semiconductor layer BILa may include silicon-germanium (SiGe) whose germanium concentration is relatively low. The lower compound semiconductor layer BILa may further include carbon (C). This configuration may be changed based on design of a semiconductor device which is intended to be implemented. The lower compound semiconductor layer BILa may be formed by using chemical vapor deposition (CVD) or atomic layer deposition (ALD). Active layers ACL and sacrificial layers SAL may be formed which are alternately stacked with each other on the lower compound semiconductor layer BILa. The active layers ACL may include one of, for example, silicon (Si), germanium (Ge), or silicon-germanium (SiGe), and the sacrificial layers SAL may include another of silicon (Si), germanium (Ge), or silicon-germanium (SiGe).

The sacrificial layer SAL may include a material having an etch selectivity with respect to the active layer ACL. For example, the sacrificial layers SAL may include silicon-germanium (SiGe), and the active layers ACL may include silicon (Si). Each of the sacrificial layers SAL may have a germanium concentration ranging from about 10 at % to about 30 at %.

Mask patterns may be formed on the first and second active regions AR1 and AR2 of the substrate 100. The mask patterns may each have a linear or bar shape that extends in a second direction D2.

A patterning process may be performed in which the mask patterns are used as an etching mask to form a trench TR that forms a first active pattern AP1 and a second active pattern AP2. The first active pattern AP1 may be formed on the first active region AR1. The second active pattern AP2 may be formed on the second active region AR2.

A stack pattern STP may be formed on each of the first and second active patterns AP1 and AP2. The trench TR may cause the lower compound semiconductor layer BILa to reside on the first and second active patterns AP1 and AP2. The lower compound semiconductor layer BILa may extend in the second direction D2. The stack pattern STP may include the active layers ACL and the sacrificial layers SAL that are alternately stacked with each other on the first and second active patterns AP1 and AP2. During the patterning process, the stack pattern STP may be formed together with the first and second active patterns AP1 and AP2.

A device isolation layer ST may be formed to fill the trench TR. For example, a dielectric layer may be provided on the substrate 100 and may be formed to cover the first and second active patterns AP1 and AP2, the stack patterns STP, and the lower compound semiconductor layer BILa. The dielectric layer may be recessed until the stack patterns STP are exposed, and thus, the device isolation layer ST may be formed.

The device isolation layer ST may include a dielectric material, such as a silicon oxide layer. The stack patterns STP may be upwardly exposed from the device isolation layer ST. For example, the stack patterns STP may vertically protrude upwards from the device isolation layer ST. The lower compound semiconductor layer BILa may be or might not be upwardly exposed from the device isolation layer ST. This configuration may be changed based on design of a semiconductor device which is intended to be fabricated.

Figure 8A:
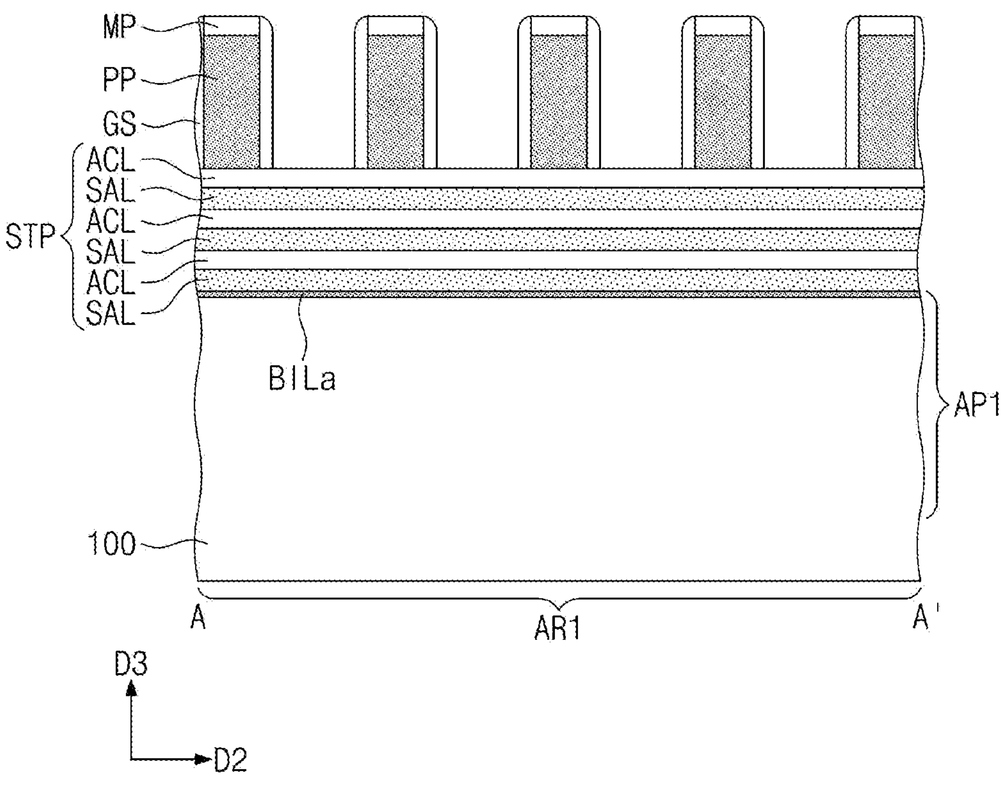
Figure 8B:
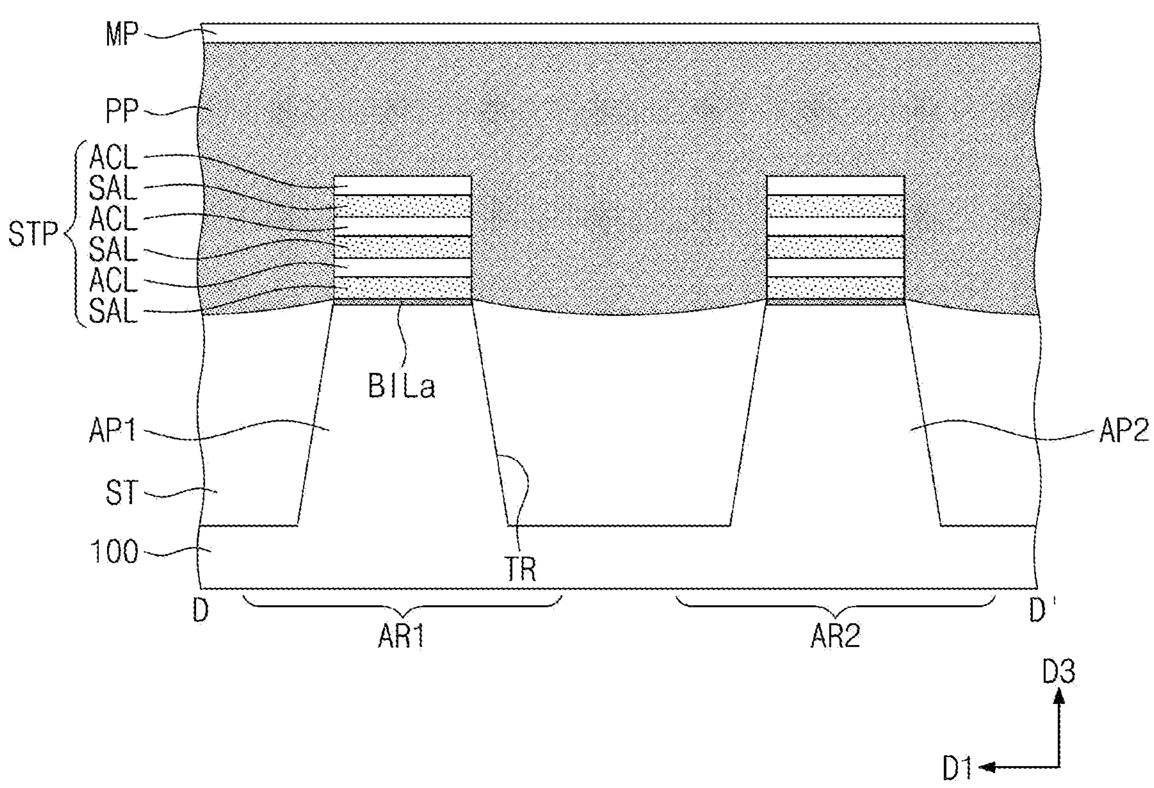

Referring to FIGS. 8A and 8B, sacrificial patterns PP may be formed on the substrate 100 to run across the stack patterns STP. For example, each of the sacrificial patterns PP may be formed to have a linear, bar shape, or a rectangular cuboid shape that extends in a first direction D1. The sacrificial patterns PP may be arranged at a first pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include, for example, polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. In an exemplary embodiment of the present inventive concept, the gate spacer GS may be a multiple layer including at least two layers.

Figure 9A:
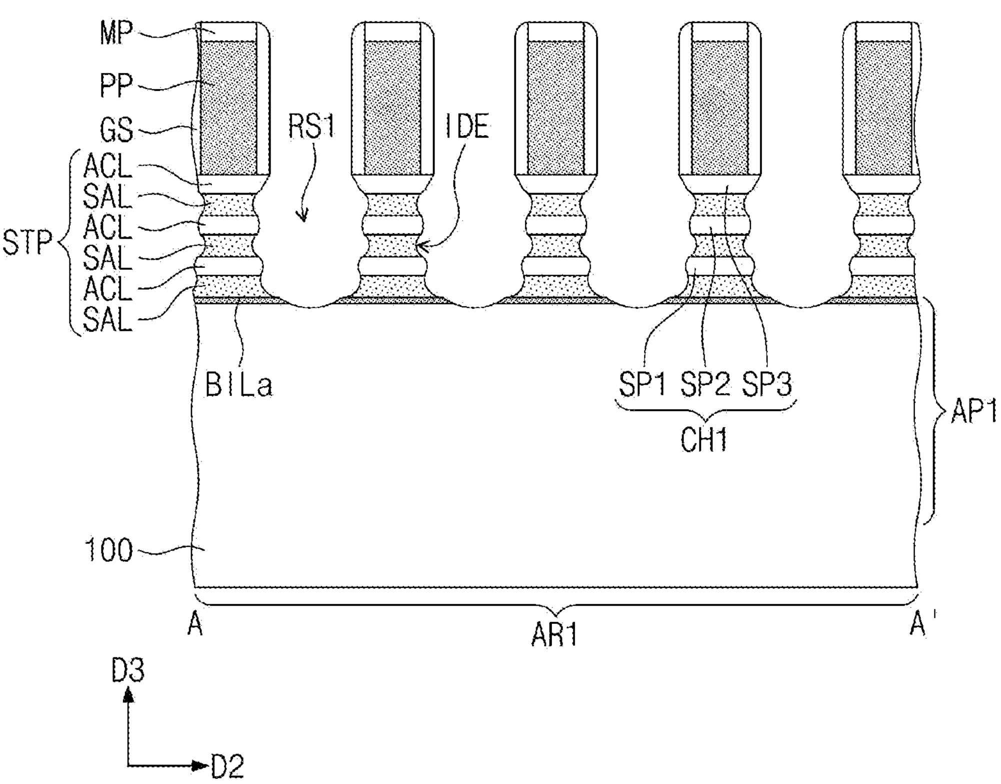
Figure 9B:
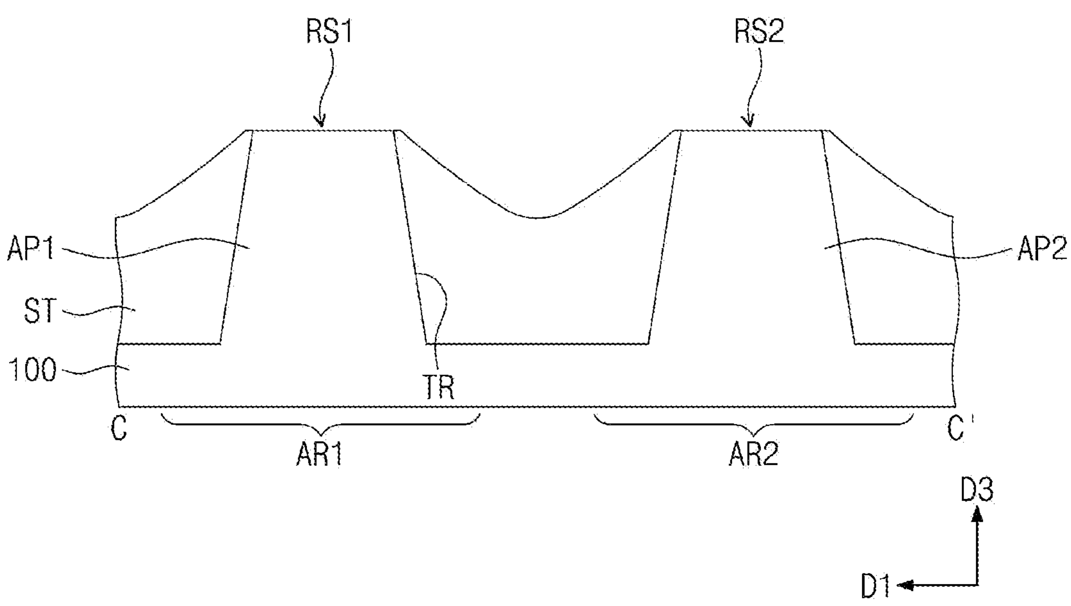
Figure 9C:
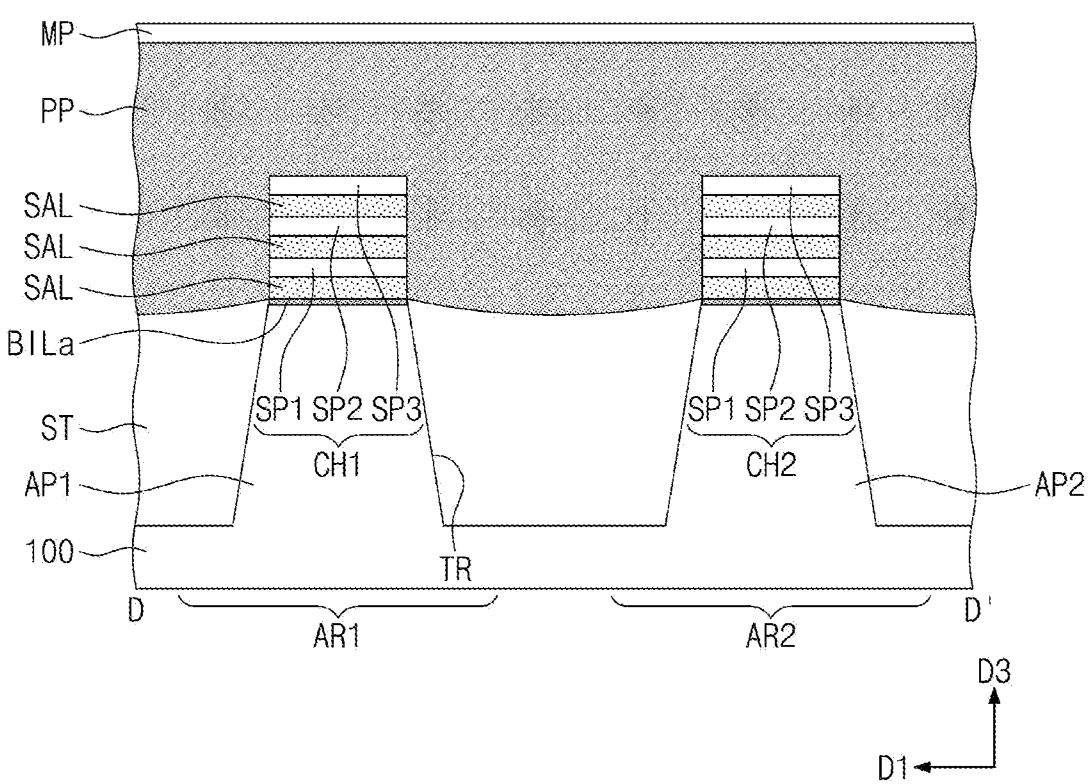

Referring to FIGS. 9A to 9C, first recesses RS1 may be formed in the stack pattern STP on the first active pattern AP1. Second recesses RS2 may be formed in the stack pattern STP on the second active pattern AP2. During the formation of the first and second recesses RS1 and RS2, the device isolation layer ST may be further recessed on opposite sides of each of the first and second active patterns AP1 and AP2 (see FIG. 9B). The first and second recesses RS1 and RS2 may penetrate the lower compound semiconductor layer BILa. For example, the lower compound semiconductor layer BILa may be cut by the first and second recesses RS1 and RS2.

For example, the hardmask patterns MP and the gate spacers GS may be used as an etching mask to etch the stack pattern STP and the lower compound semiconductor layer BILa on the first active pattern AP1, which may result in the formation of the first recesses RS1. The first recess RS1 may be formed between a pair of sacrificial patterns PP. The formation of the first recess RS1 may include additionally performing a selective etching process on the exposed sacrificial layers SAL. The selective etching process may indent each of the sacrificial layers SAL to form an indention IDE. For example, the indentation IDE may have a concave shape. Thus, the first recess RS1 may have a wavelike inner sidewall. For example, an inner sidewall of the first recess RS1 may be uneven. The second recesses RS2 in the stack pattern STP on the second active pattern AP2 may be formed by the same method used for the formation of the first recesses RS1.

The active layers ACL may be formed into first, second, and third semiconductor patterns SP1, SP2, and SP3 that are sequentially stacked between neighboring first recesses RS1. A first channel pattern CH1 may be constituted by the first, second, and third semiconductor patterns SP1, SP2, and SP3 between neighboring first recesses RS1. A second channel pattern CH2 may be constituted by the first, second, and third semiconductor patterns SP1, SP2, and SP3 between neighboring second recesses RS2.

Figure 10A:
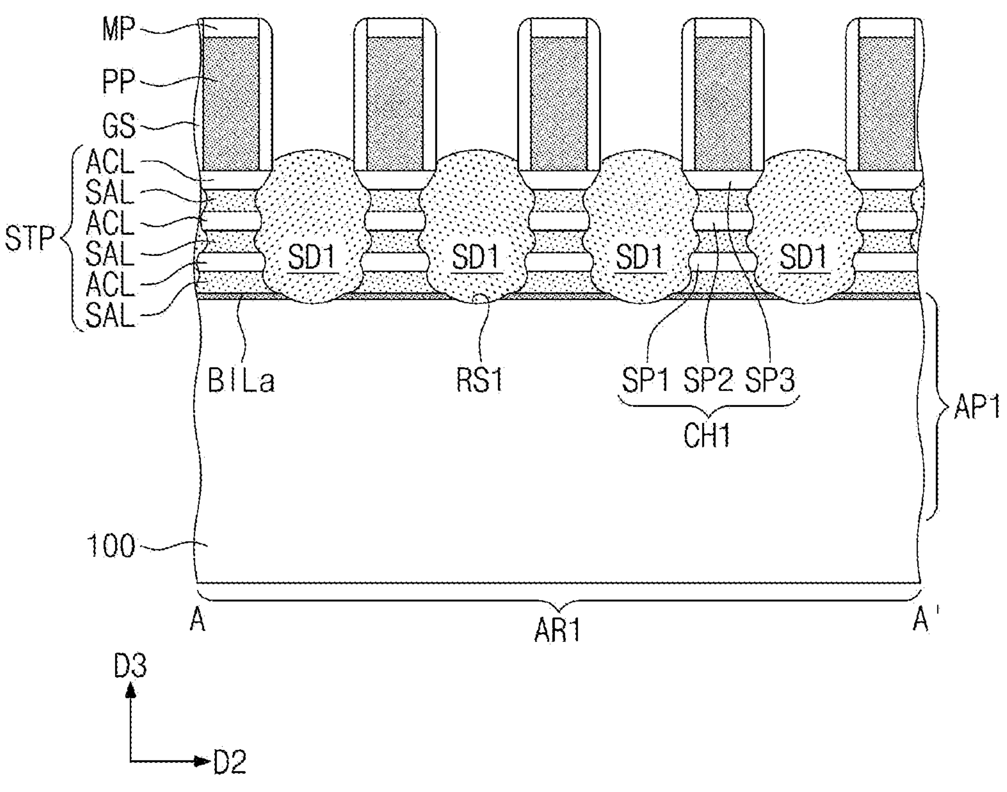
Figure 10B:
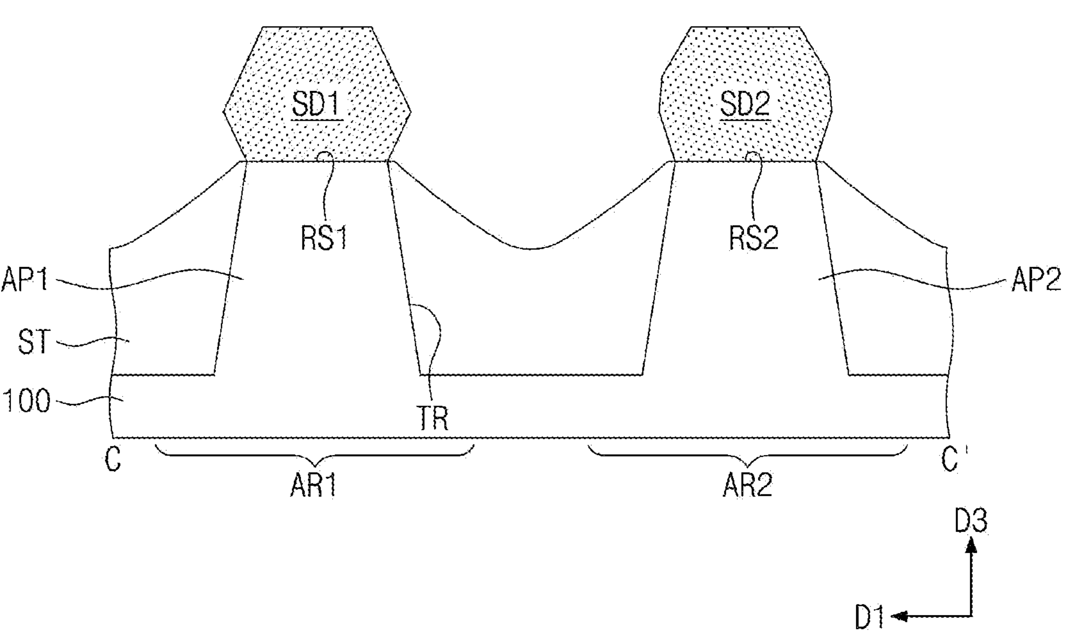
Figure 10C:
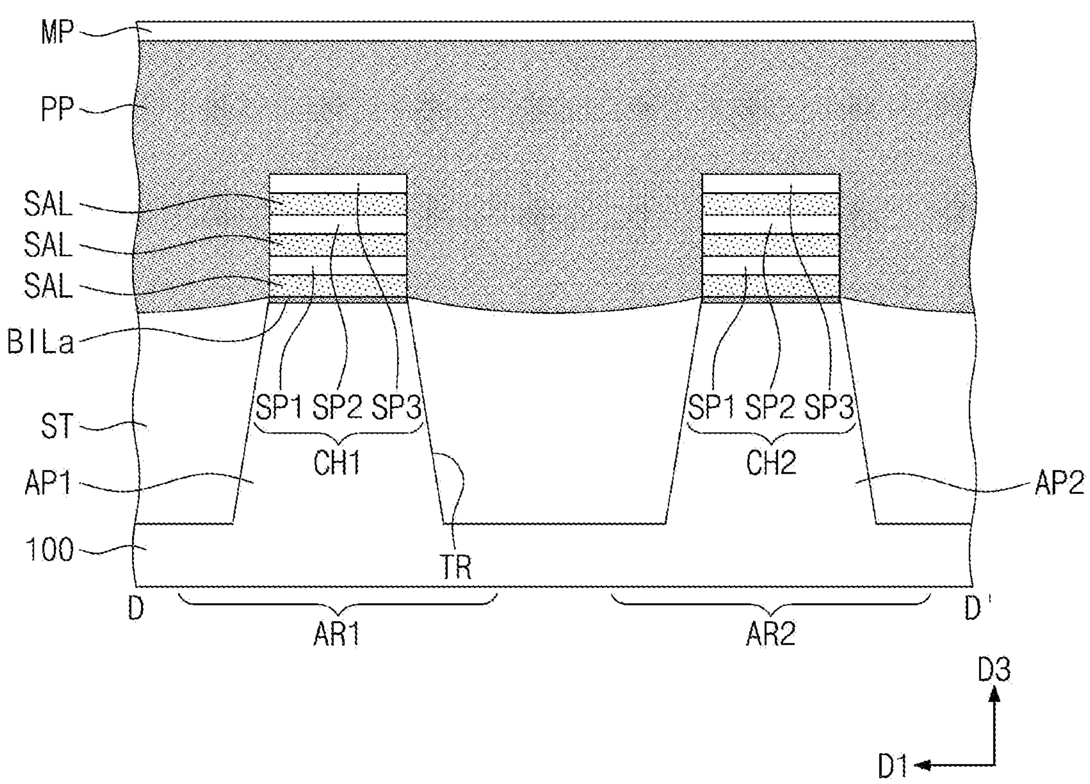

Referring to FIGS. 10A to 10C, first source/drain patterns SD1 may be correspondingly formed in the first recesses RS1. For example, a selective epitaxial growth (SEG) process may be performed in which the inner sidewall of the first recess RS1 is used as a seed layer to form an epitaxial layer that fills the first recess RS1. The epitaxial layer may be grown from a seed, or the substrate 100 and the first, second, and third semiconductor patterns SP1, SP2, and SP3 exposed by the first recess RS1. For example, the SEG process may include chemical vapor deposition (CVD) or molecular beam epitaxy (MBE).

In an exemplary embodiment of the present inventive concept, the first source/drain pattern SD1 may include the same semiconductor element (e.g., Si) as that of the substrate 100. While the first source/drain pattern SD1 is formed, impurities (e.g., phosphorus, arsenic, or antimony) may be in-situ implanted to cause the first source/drain pattern SD1 to have an n-type conductivity. In addition, after the first source/drain pattern SD1 is formed, impurities may be implanted into the first source/drain pattern SD1.

Second source/drain patterns SD2 may be correspondingly formed in the second recesses RS2. For example, a selective epitaxial growth (SEG) process may be performed in which an inner sidewall of the second recess RS2 is used as a seed to form the second source/drain pattern SD2.

In an exemplary embodiment of the present inventive concept, the second source/drain patterns SD2 may include a semiconductor element (e.g., SiGe) whose lattice constant is greater than that of a semiconductor element of the substrate 100. While the second source/drain pattern SD2 is formed, impurities (e.g., boron, gallium, or indium) may be in-situ implanted to cause the second source/drain pattern SD2 to have a p-type conductivity. In addition, after the formation of the second source/drain pattern SD2, impurities may be implanted into the second source/drain pattern SD2.

Figure 11A:
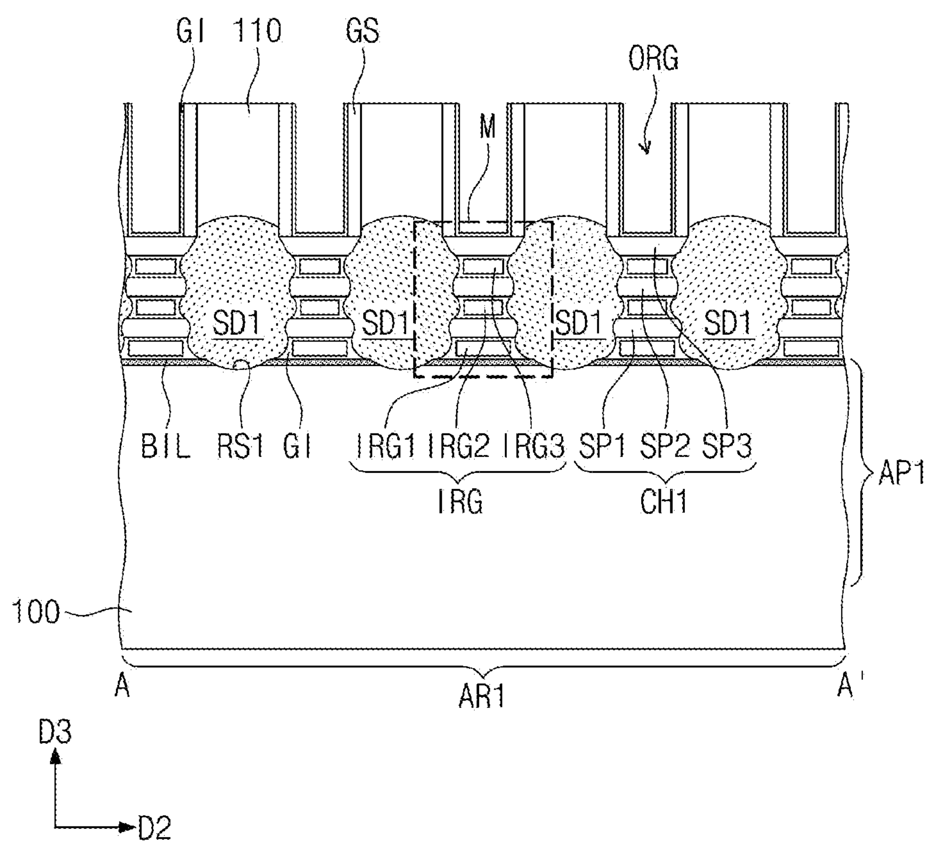
Figure 11B:
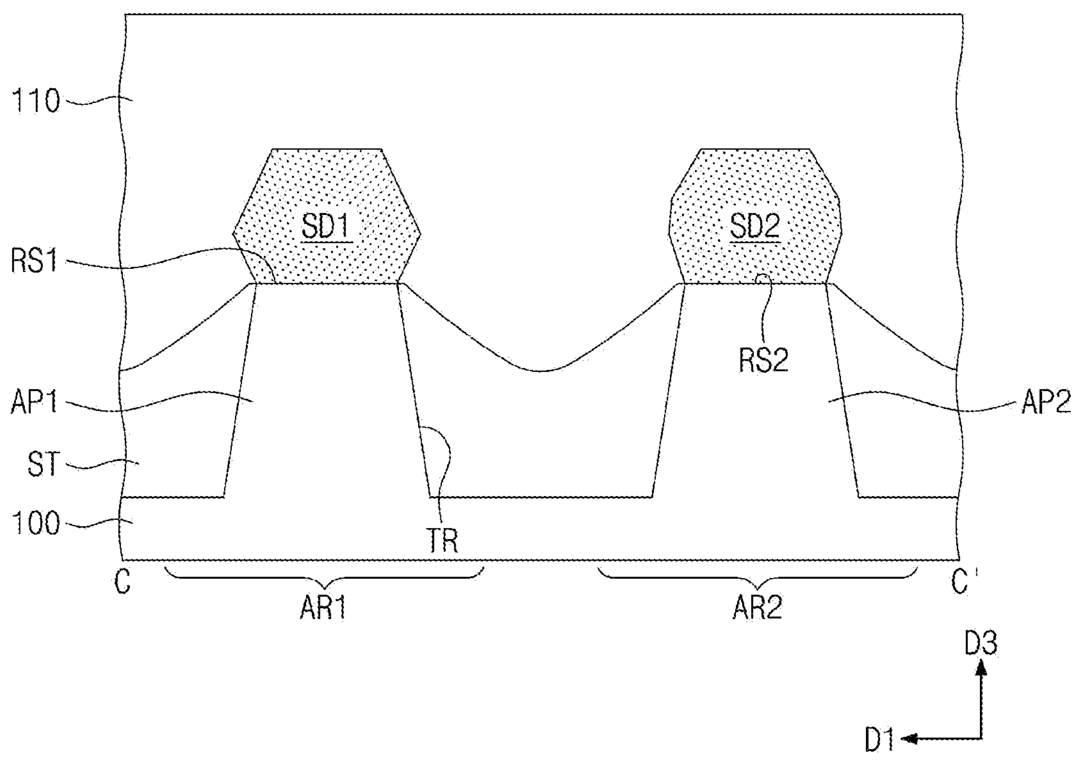
Figure 11C:
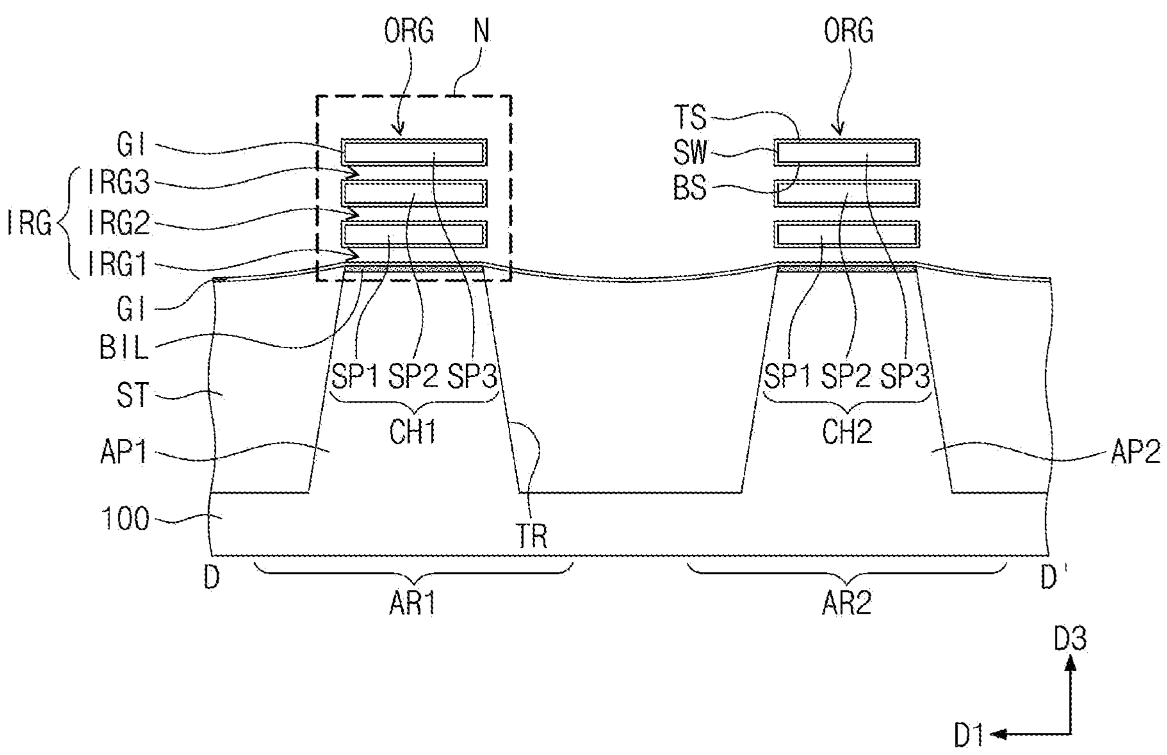

Referring to FIGS. 11A to 11C, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface substantially coplanar with those of the sacrificial patterns PP and those of the gate spacers GS.

The exposed sacrificial patterns PP may be selectively removed. The removal of the sacrificial patterns PP may form an outer region ORG that exposes the first and second channel patterns CH1 and CH2 (see FIG. 11C). The removal of the sacrificial patterns PP may include performing a wet etching process using an etchant that selectively etches polysilicon.

The sacrificial layers SAL exposed through the outer region ORG may be selectively removed to form inner regions IRG (see FIG. 11C). For example, an etching process that selectively etches the sacrificial layers SAL may be performed such that only the sacrificial layers SAL may be removed while leaving the first, second, and third semiconductor patterns SP1, SP2, and SP3. The etching process may have a high etch rate with respect to silicon-germanium whose germanium concentration is relatively low. For example, the etching process may have a high etch rate with respect to silicon-germanium whose germanium concentration is greater than about 10 at %.

The etching process may remove the sacrificial layers SAL on the first and second active regions AR1 and AR2. For example, the etching process may be a wet etching process. The etching material used for the etching process may promptly etch the sacrificial layer SAL whose germanium concentrate is relatively high. While the wet etching process is performed, the lower compound semiconductor layer BILa might not be removed. This situation may be caused by the fact that the lower compound semiconductor layer BILa includes germanium (Ge) whose concentration is relatively low.

Referring back to FIG. 11C, as the sacrificial layers SAL are selectively removed, the first, second, and third semiconductor patterns SP1, SP2, and SP3 may remain on each of the first and second active patterns AP1 and AP2. The removal of the sacrificial layers SAL may form the first, second, and third inner regions IRG1, IRG2, and IRG3.

For example, the first inner region IRG1 may be formed between the first semiconductor pattern SP1 and the active pattern AP1 or AP2. The second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 11A to 11C, a gate dielectric layer GI may be formed on the exposed first, second, and third semiconductor patterns SP1, SP2, and SP3. The gate dielectric layer GI may be formed to at least partially surround each of the first, second, and third semiconductor patterns SP1, SP2, and SP3. Simultaneously with the formation of the gate dielectric layer GI, the lower compound semiconductor layer BILa may be converted into a lower dielectric pattern BIL.

Figure 13A:
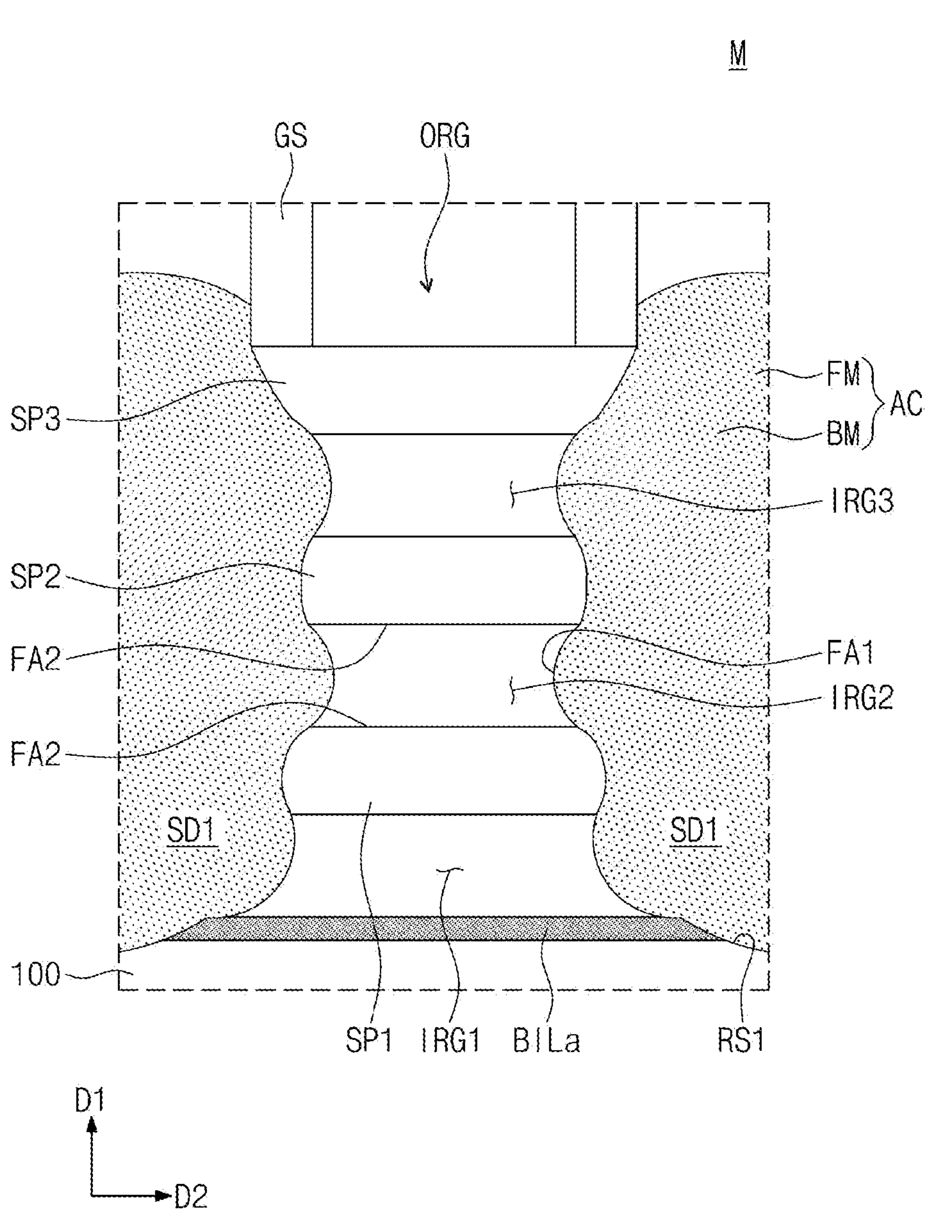
FIGS. 13A, 14A, and 15A illustrate enlarged views showing a method of forming section M depicted in FIG. 11A.
Figure 13B:
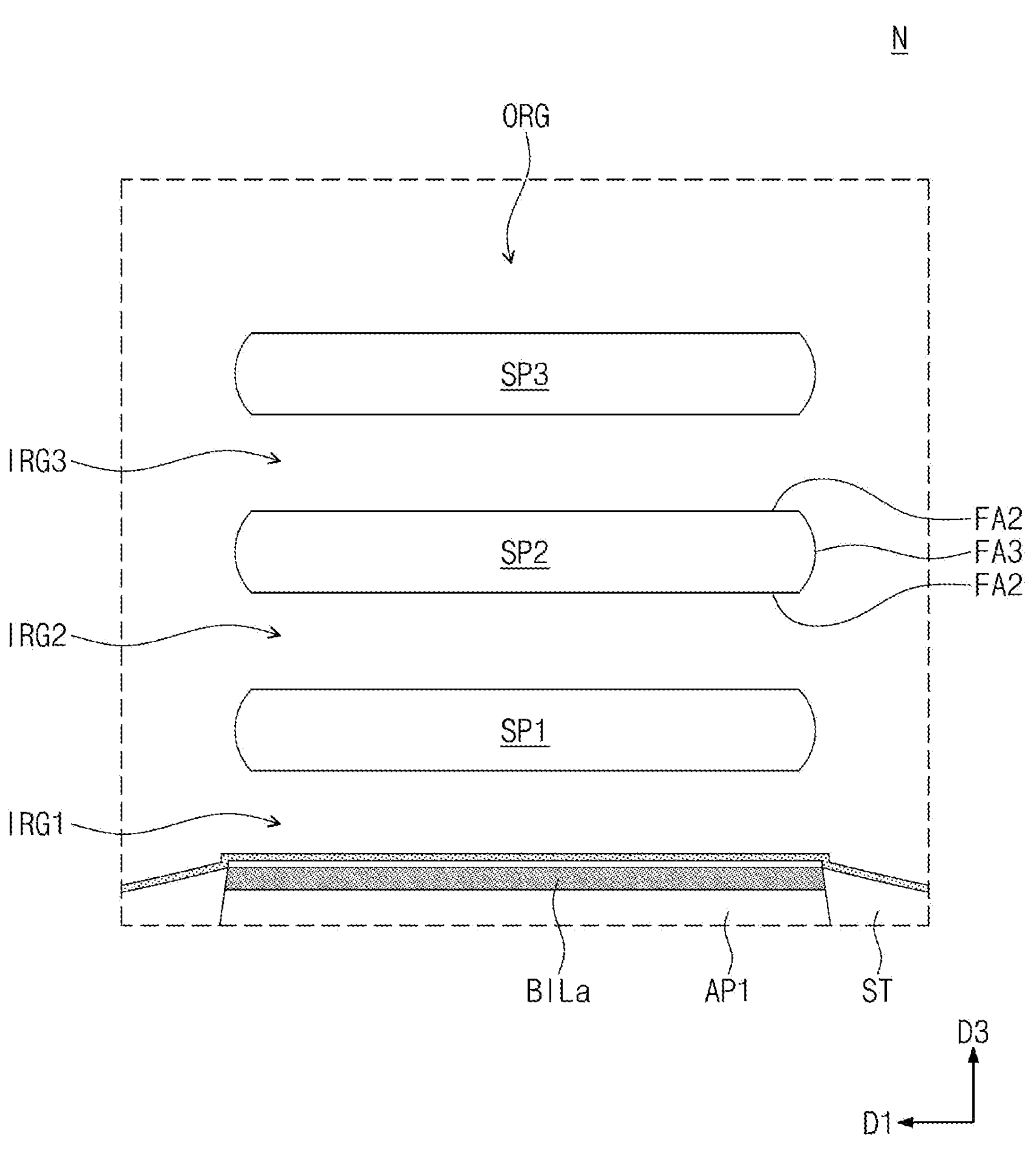
FIGS. 13B, 14B, and 15B illustrate enlarged views showing a method of forming section N depicted in FIG. 11C.
Figure 14A:
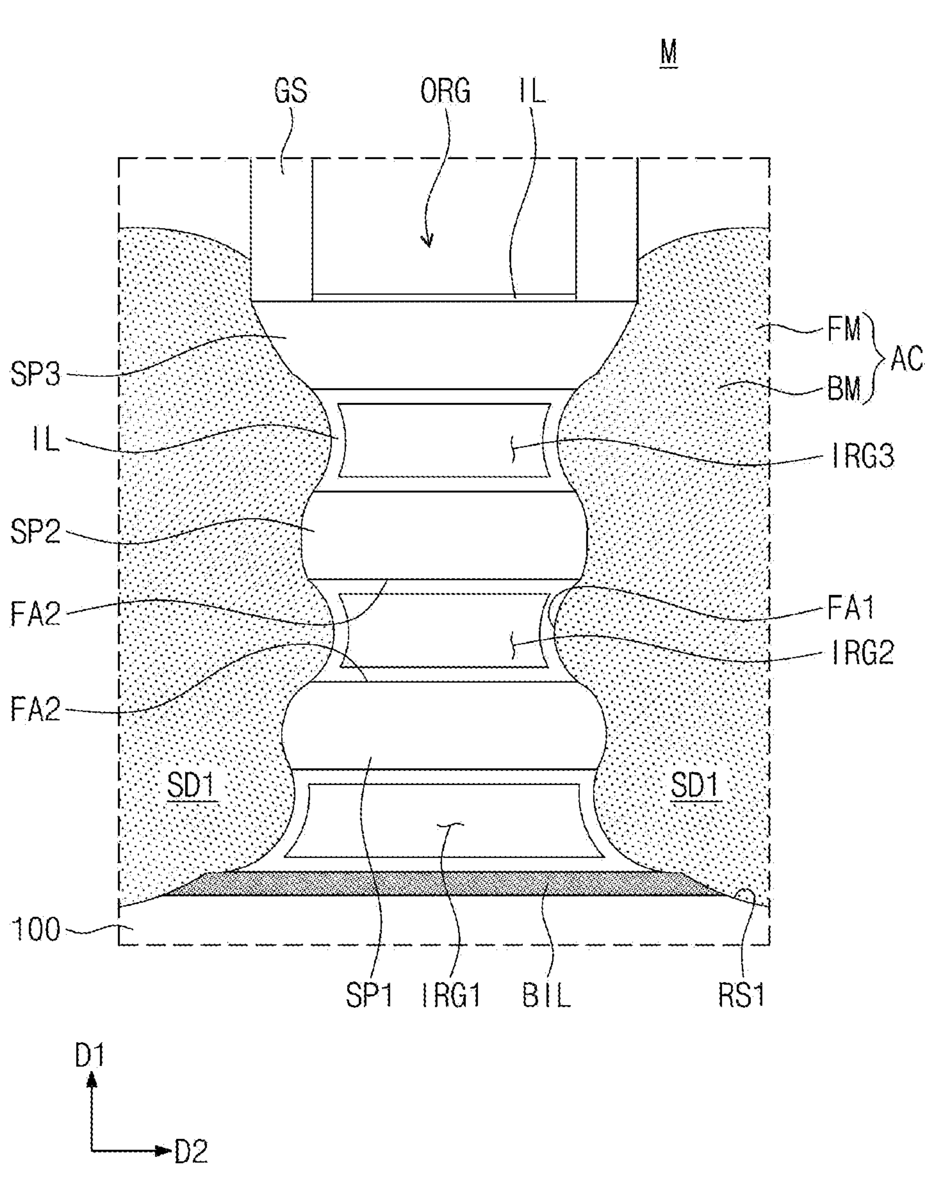
Figure 14B:
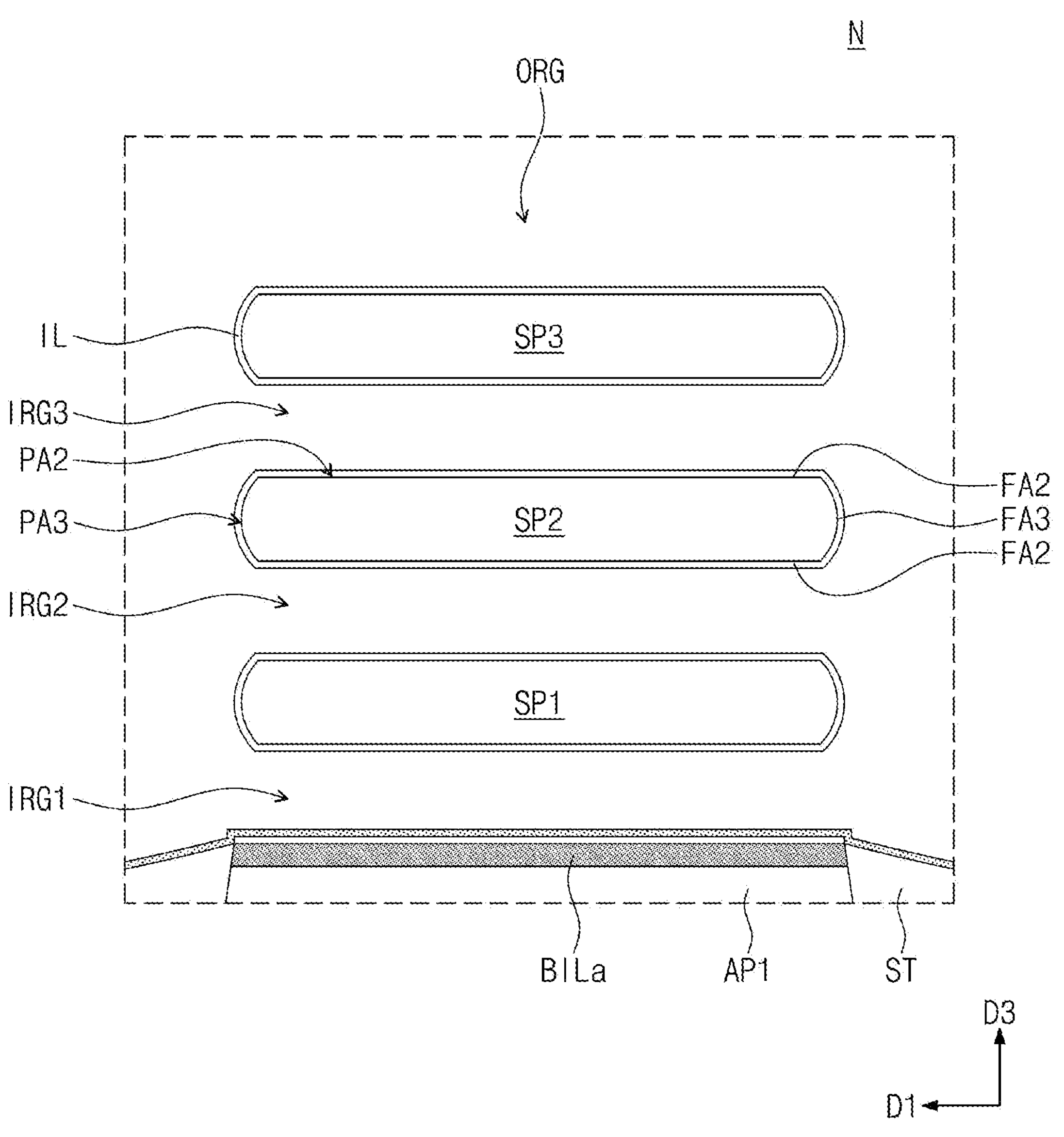
Figure 15A:
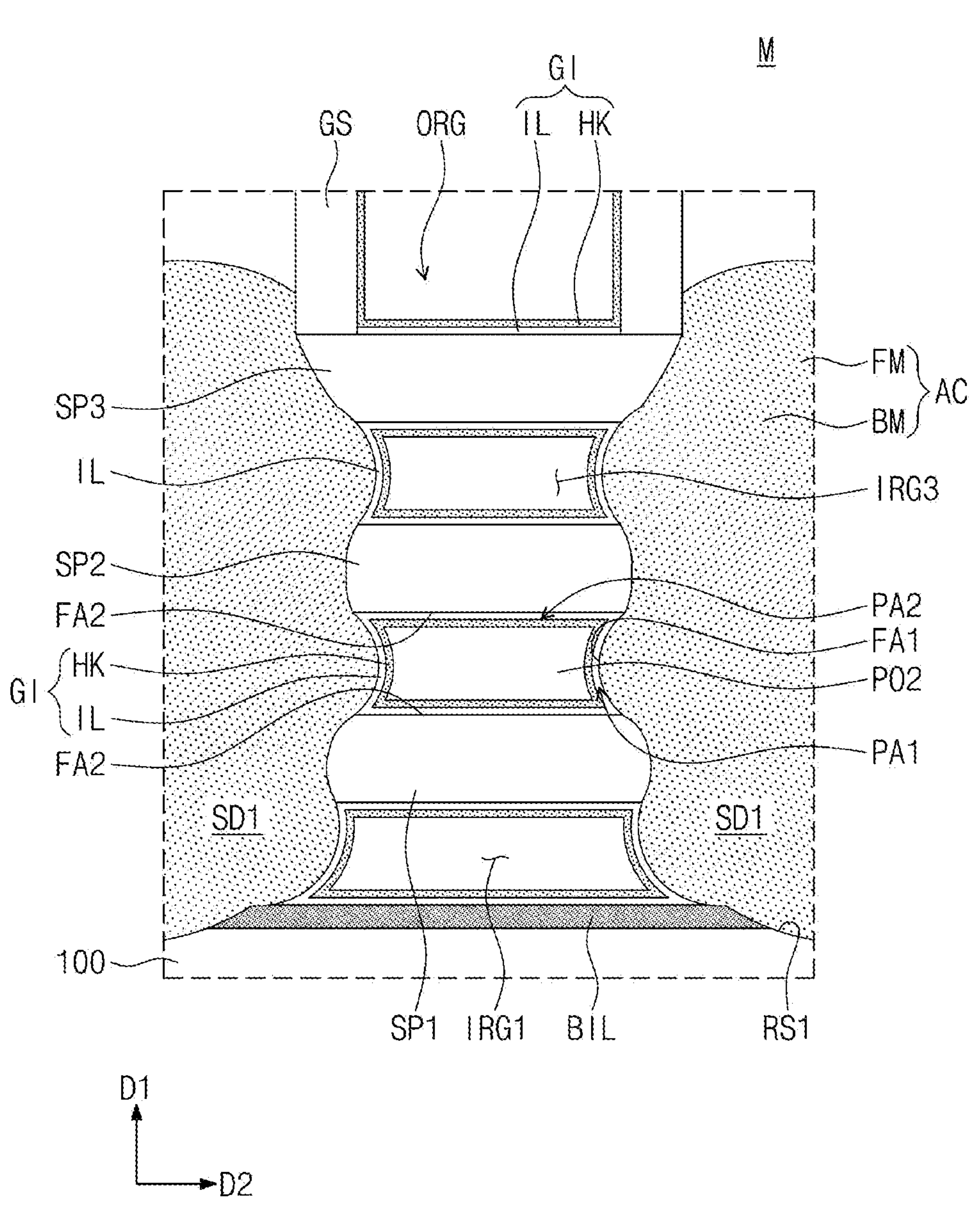
Figure 15B:
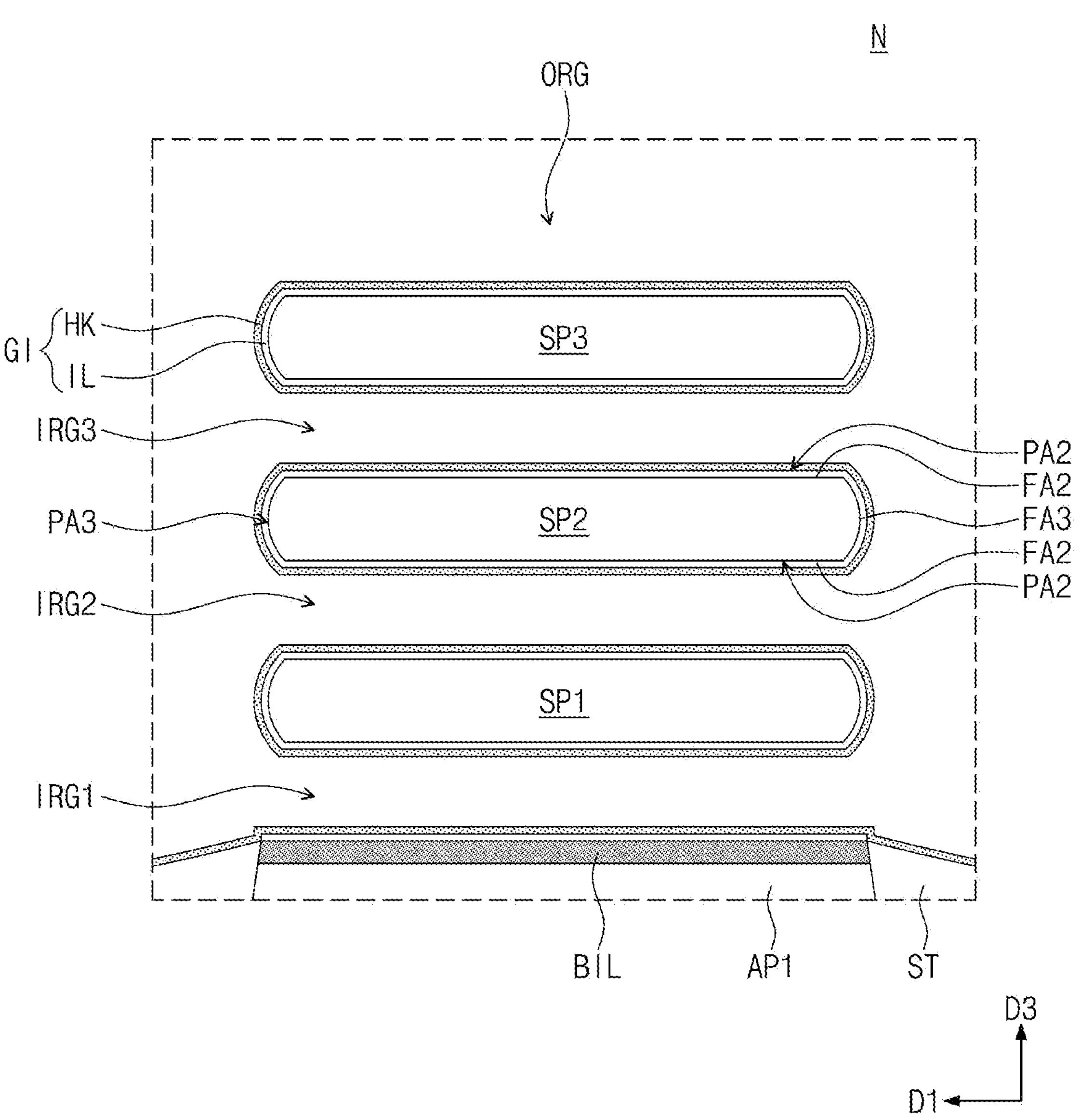

FIGS. 13A, 14A, and 15A illustrate enlarged views showing a method of forming section M of FIG. 11A. FIGS. 13B, 14B, and 15B illustrate enlarged views showing a method of forming section N depicted in FIG. 11C.

Referring to FIGS. 13A and 13B, as discussed above, the sacrificial patterns PP may be selectively removed to form the outer region ORG. The sacrificial layers SAL exposed through the outer region ORG may be selectively removed to form the first to third inner regions IRG1 to IRG3.

Referring to FIG. 13A, as a representative example, the second inner region IRG2 may expose a first facet FA1 of the first source/drain pattern SD1. The second inner region IRG2 may expose a second facet FA2 of each of the first and second semiconductor patterns SP1 and SP2. The second facet FA2 may be a crystal plane having a normal line in a direction parallel to a top surface of the substrate 100. For example, the first facet FA1 may be a {110} crystal plane. The second facet FA2 may be a crystal plane having a normal line in a direction substantially perpendicular to the top surface of the substrate 100. For example, the second facet FA2 may be a {100} crystal plane. The first inner region IRG1 may expose a top surface of the lower compound semiconductor layer BILa.

Referring to FIG. 13B, as a representative example, the second semiconductor pattern SP2 may be exposed on top, bottom, and opposite lateral surfaces thereof. A third facet FA3 may be given to each of the opposite lateral surfaces of the second semiconductor pattern SP2. A second facet FA2 may be given to each of the top and bottom surfaces of the second semiconductor pattern SP2.

Referring to FIGS. 14A and 14B, an interface layer IL may be formed in the outer region ORG and the first to third inner regions IRG1 to IRG3. The interface layer IL may be selectively formed on an exposed semiconductor crystal plane exposed by the outer region ORG and the first to third inner regions IRG1 to IRG3. In an exemplary embodiment of the present inventive concept, the interface layer IL might not be formed on the gate spacer GS. In an exemplary embodiment of the present inventive concept, the interface layer IL may also be formed on the gate spacer GS. The interface layer IL may also be formed between the lower dielectric pattern BIL and the first portion PO1 of the gate electrode GE. In an exemplary embodiment of the present inventive concept, the interface layer IL might not be formed between the lower dielectric pattern BIL and the first portion PO of the gate electrode GE.

In an exemplary embodiment of the present inventive concept, the formation of the interface layer IL may be controlled such that a formation rate of the interface layer IL on the first facet FA1 that is a {110} crystal plane is greater that of the interface layer IL on the second facet FA2 that is a {100} crystal plane. For example, the formation rate in a horizontal direction of the interface layer IL may be adjusted to become greater than the formation rate in a vertical direction of the interface layer IL.

The formation of the interface layer IL may include one or both of a semiconductor oxidation process and an oxide deposition process. As discussed above, the formation of the interface layer IL may be controlled to have different formation rates in horizontal and vertical directions.

In this description, the term "formation rate" may indicate a growth rate or a deposition rate of the interface layer IL during its formation process. For example, when the interface layer IL is formed by a semiconductor oxidation process, the formation of the interface layer IL may be a growth rate. For another example, when the interface layer 1L is formed by an oxide deposition process, the formation rate of the interface layer IL may be a deposition rate.

The lower dielectric pattern BIL may be formed simultaneously with the interface layer IL. For example, the formation of the lower dielectric pattern BIL may include a semiconductor oxidation process. The lower dielectric pattern BIL may be formed by oxidizing the lower compound semiconductor layer BILa. In an exemplary embodiment of the present inventive concept, the lower dielectric pattern BIL may have a thickness substantially the same as that of the lower compound semiconductor layer BILa. In an exemplary embodiment of the present inventive concept, the lower dielectric pattern BIL may have a thickness greater or less than that of the lower compound semiconductor layer BILa.

Referring to FIGS. 15A and 15B, a high-k dielectric layer HK may be formed in the outer region ORG and the first to third inner regions IRG1 to IRG3. The high-k dielectric layer HK may be formed on the interface layer IL. The interface layer IL and the high-k dielectric layer HK may constitute a gate dielectric layer GI.

In an exemplary embodiment of the present inventive concept, the high-k dielectric layer HK may be conformally formed. For example, a thickness in a horizontal direction of the high-k dielectric layer HK may be substantially the same as a thickness in a vertical direction of the high-k dielectric layer HK.

Figure 12A:
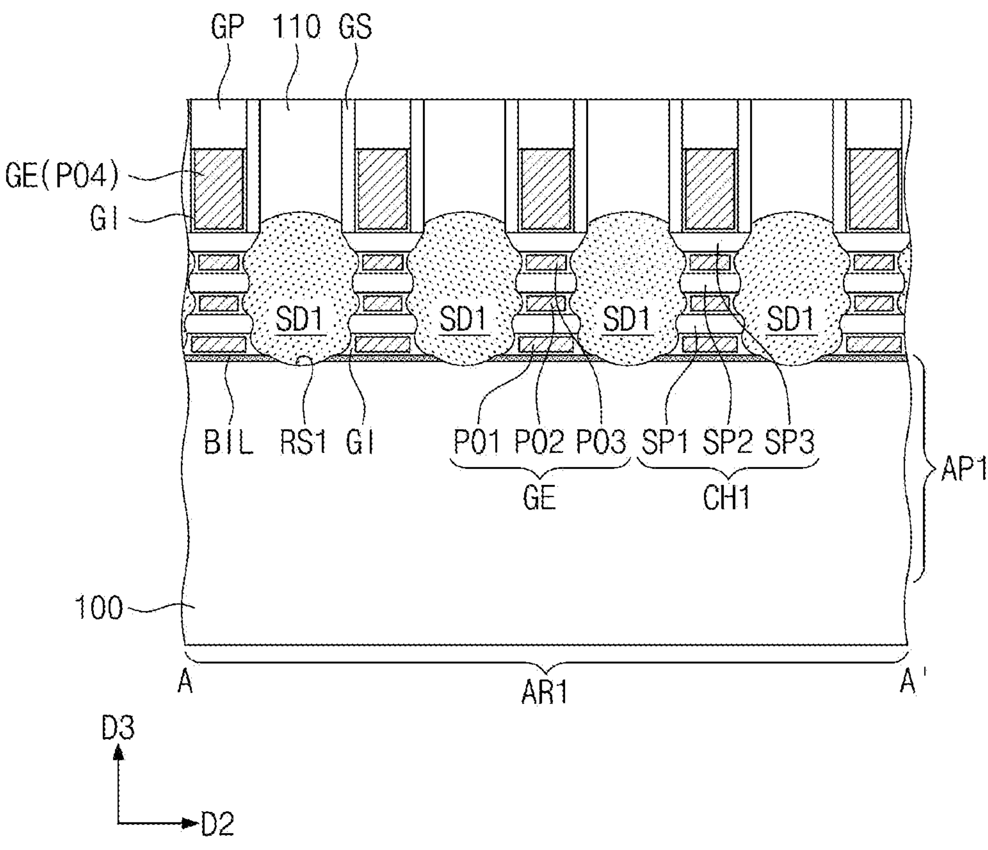
Figure 12B:
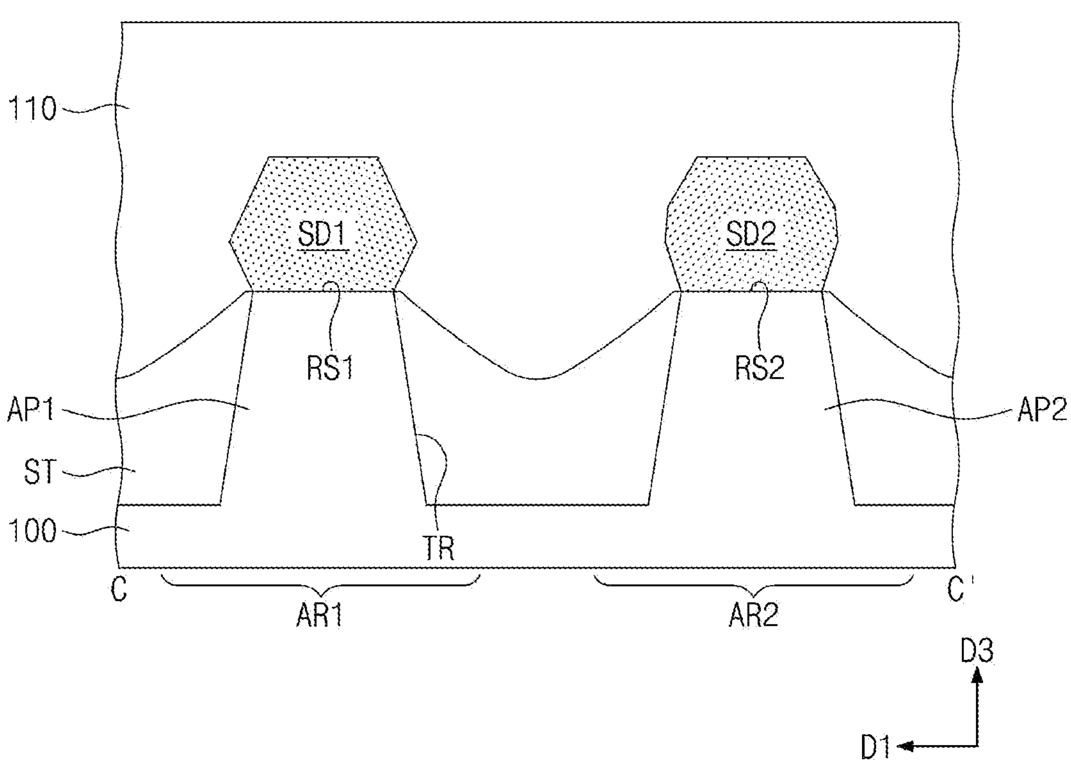
Figure 12C:
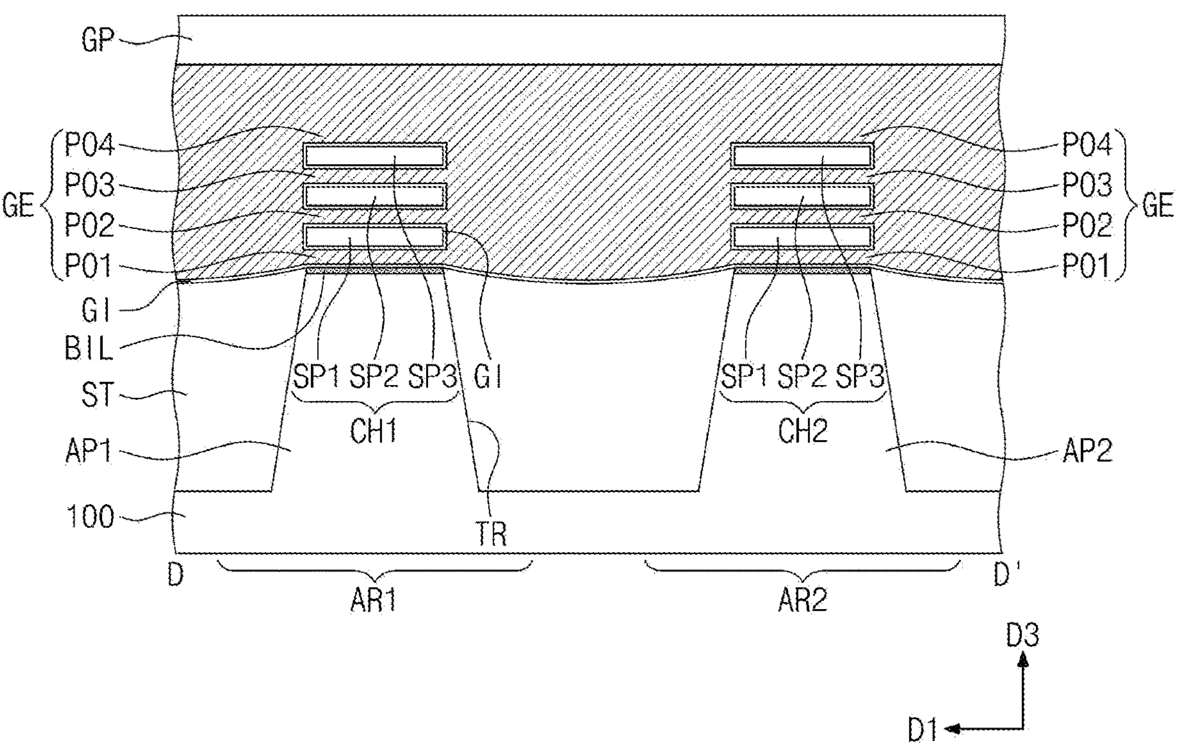

Referring to FIGS. 12A to 12C, a gate electrode GE may be formed on the gate dielectric layer GI. The gate electrode GE may include first, second, and third portions PO1, PO2, and PO3 respectively formed in the first, second, and third inner regions IRG1, IRG2, and IRG3, and may also include a fourth portion PO4 formed in the outer region ORG. The gate electrode GE may be recessed to have a reduced height with respect to the height of the gate spacers GS. A gate capping pattern GP may be formed on the recessed gate electrode GE.

Referring back to FIGS. 5A to 5D, a second interlayer dielectric layer 120 may be formed on the first interlayer dielectric layer 110. The second interlayer dielectric layer 120 may include, for example, a silicon oxide layer. Active contacts AC may be formed to penetrate the second and first interlayer dielectric layers 120 and 110 to come into electrical connection with the first and second source/drain patterns SD1 and SD2. A gate contact GC may be formed to penetrate the second interlayer dielectric layer 120 and the gate capping pattern GP to come into electrical connection with the gate electrode GE.

The formation of each of the active contact AC and the gate contact GC may include forming a barrier pattern BM and a conductive pattern FM on the barrier pattern BM. The barrier pattern BM may be conformally formed and may have a double layer. For example, the barrier pattern BM may be formed in trenches that penetrate the second and first dielectric layers 120 and 110 and a trench that penetrates the second interlayer dielectric layer 120 and the gate capping pattern GP. For example, the barrier pattern BM may include a metal layer and a metal nitride layer. The conductive pattern FM may include low-resistance metal.

Separation structures DB may be correspondingly formed on a first boundary BD1 and a second boundary BD2 of the single height cell SHC. The separation structure DB may extend from the second interlayer dielectric layer 120 through the gate electrode GE and the lower dielectric pattern BIL into the active pattern AP1 or AP2. The separation structure DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

The following will discuss various exemplary embodiments of the present inventive concept. In the embodiments that follow, a detailed description of technical features repetitive to those formerly discussed with reference to FIGS. 6A and 6B will be omitted, and differences thereof will be discussed.

Figure 16:
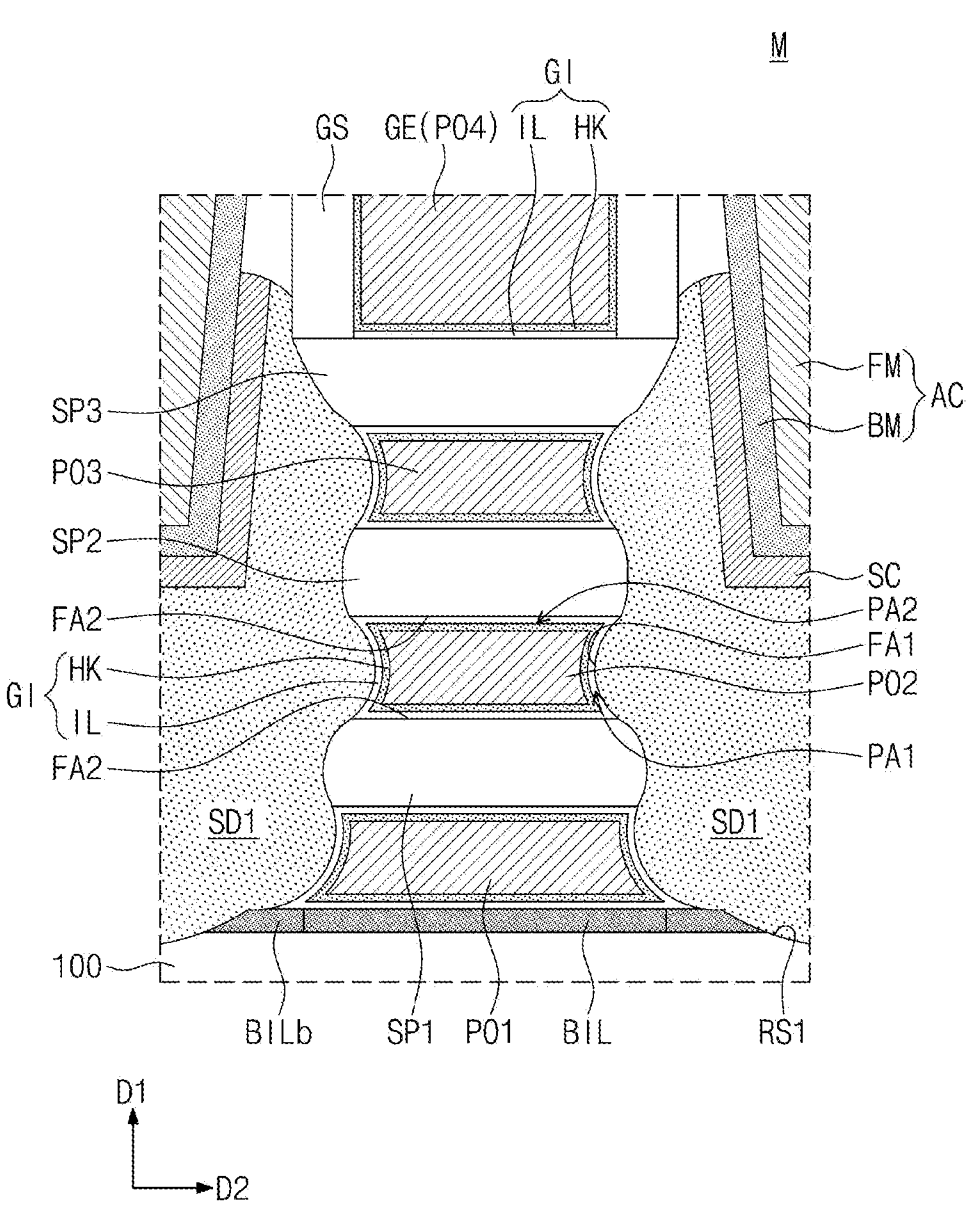
FIGS. 16 and 17A illustrate enlarged views showing section M depicted in FIG. 5A according to an exemplary embodiment of the present inventive concept.
Figure 17A:
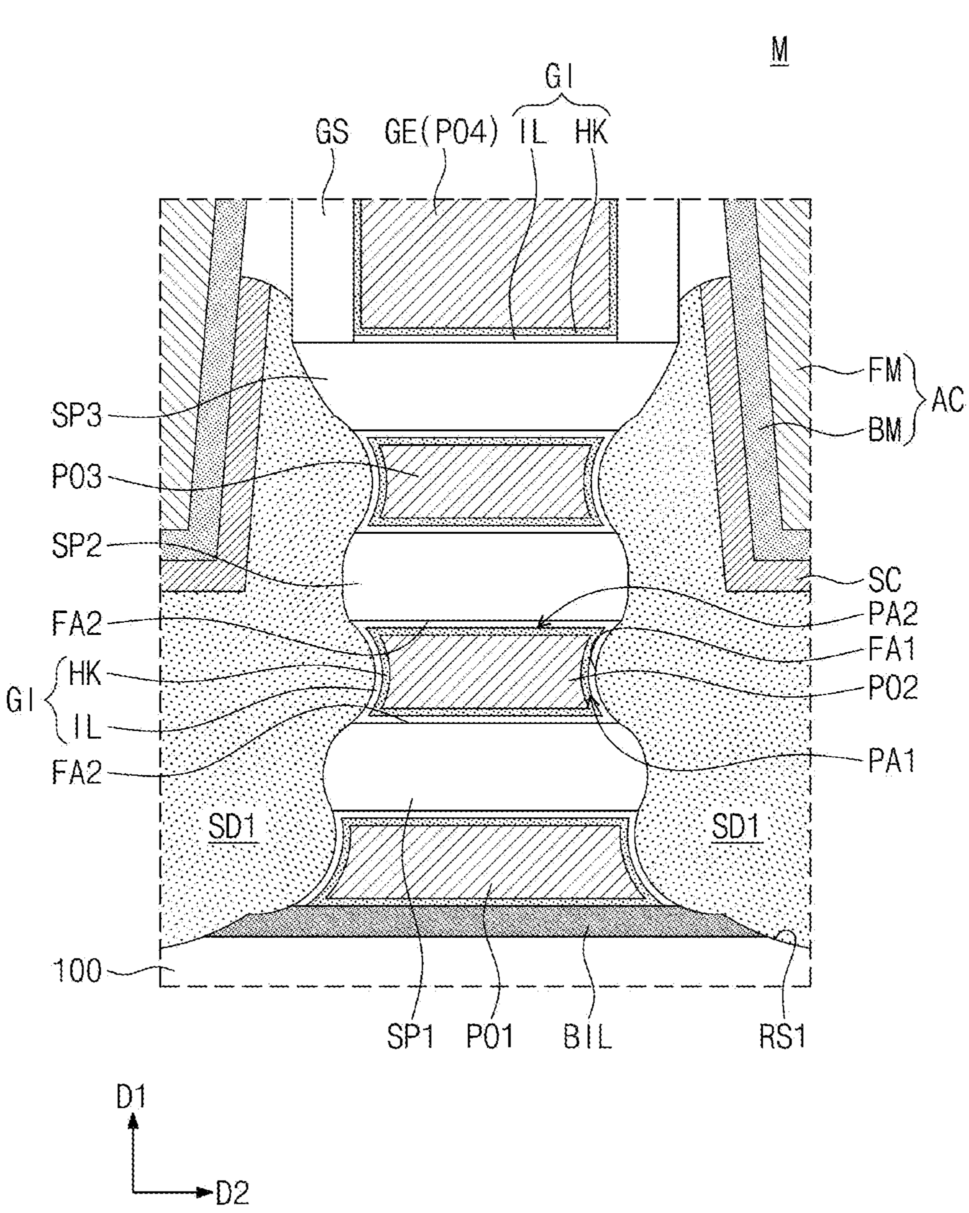
Figure 17B:
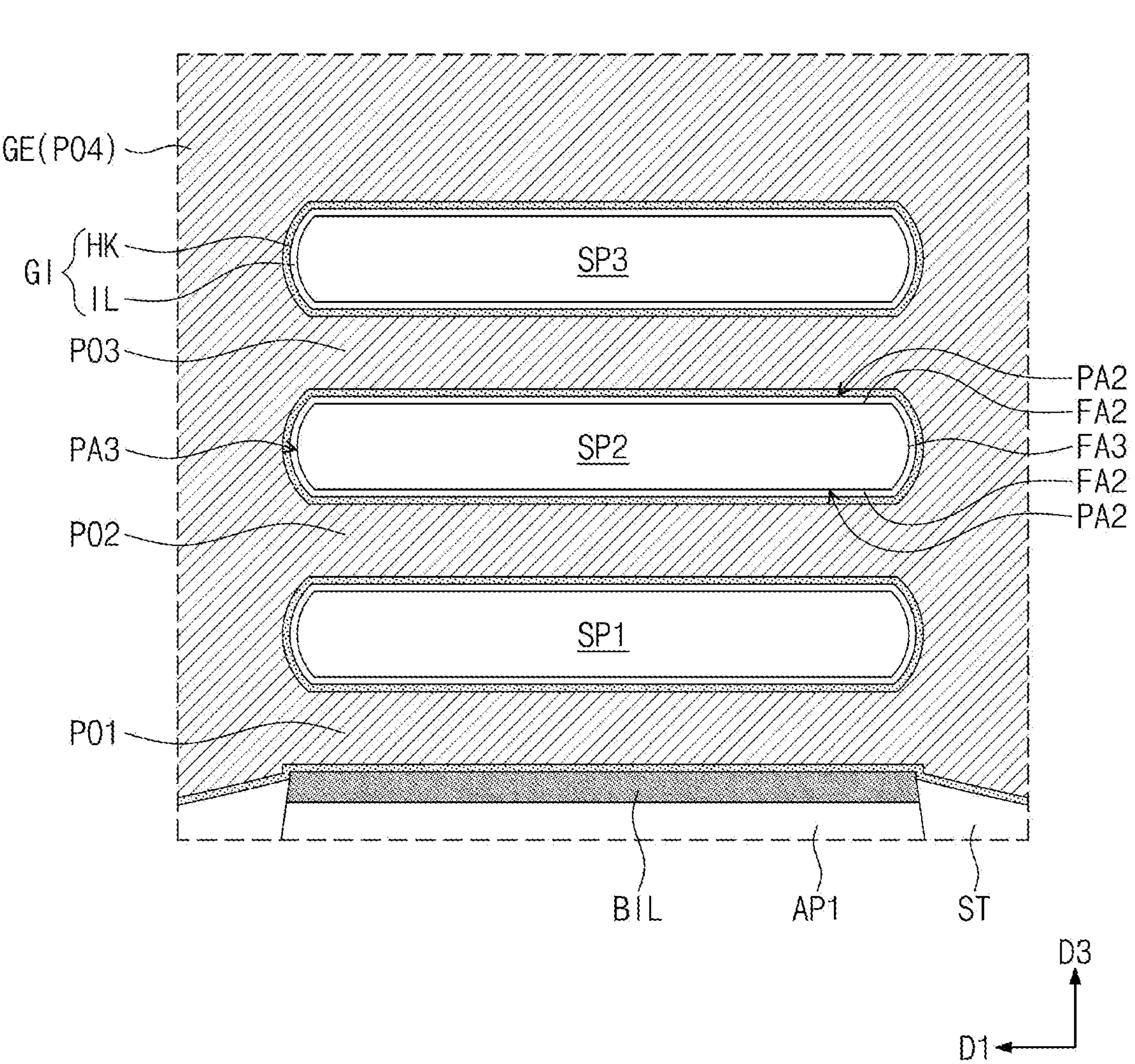
FIG. 17B illustrates an enlarged view showing section N depicted in FIG. 5D according to an exemplary embodiment of the present inventive concept.

FIGS. 16 and 17A illustrate enlarged views showing a section M depicted in FIG. 5A according to an exemplary embodiment of the present inventive concept. FIG. 17B illustrates an enlarged view showing a section N depicted in FIG. 5D according to an embodiment of the present inventive concept.

Referring to FIG. 16, the lower dielectric pattern BIL might not be in contact with the first source/drain patterns SD1. A residual compound semiconductor BILb may be interposed between the first source/drain patterns SD1 and the lower dielectric pattern BIL. The residual compound semiconductor BILb may be interposed between the second source/drain patterns SD2 and the lower dielectric pattern BIL. The residual compound semiconductor BILb may be in contact with the first and second source/drain patterns SD1 and SD2. The residual compound semiconductor BILb may be a portion of the lower compound semiconductor layer BILa that remains without being oxidized during the semiconductor oxidation process discussed with reference to FIGS. 14A and 14B. The lower dielectric pattern BIL and the residual compound semiconductor BILb may be located at substantially the same level. The top surface of the lower dielectric pattern BIL and the top surface of the residual compound semiconductor BILb may be substantially coplanar with each other. The bottom surface of the lower dielectric pattern BIL and the bottom surface of the residual compound semiconductor BILb may be substantially coplanar with each other. The residual compound semiconductor BILb and the lower compound semiconductor layer BILa may include the same material as each other. For example, the residual compound semiconductor BILb may include patterned silicon-germanium.

Referring to FIGS. 17A and 17B, the interface layer IL might not be provided between the lower dielectric pattern BIL and the high-k dielectric layer HK that surrounds the first portion PO1 of the gate electrode GE. A top surface of the lower dielectric pattern BIL may be in contact with a lowermost surface of the high-k dielectric layer HK that surrounds the first portion PO1 of the gate electrode GE.

For a three-dimensional field effect transistor according to an exemplary embodiment of the present inventive concept, a lower dielectric pattern, which has a thickness is greater than that of an interface layer, may be between an active pattern and a lowermost portion of the gate electrode. Therefore, a distance between the gate electrode and a substrate may be increased to reduce a capacitance between the gate electrode and the substrate. Accordingly, it may be possible to improve electrical properties of a semiconductor device according to an exemplary embodiment of the present inventive concept.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor device, comprising:

a substrate that includes an active pattern;

a channel pattern disposed on the active pattern, wherein the channel pattern includes a plurality of semiconductor patterns that are stacked on each other and spaced apart from each other;

a source/drain pattern connected to the plurality of semiconductor patterns;

a gate electrode disposed on the plurality of semiconductor patterns, the gate electrode extending in a first direction;

a gate dielectric layer disposed between the plurality of semiconductor patterns and the gate electrode;

a lower dielectric pattern disposed between the active pattern and the gate dielectric layer; and a silicon-germanium (SiGe) pattern disposed between a sidewall of the source/drain pattern and a sidewall of the lower dielectric pattern, wherein the silicon-germanium pattern is at a level substantially the same as a level of the lower dielectric pattern, wherein the gate dielectric layer includes an interface layer and a high-k dielectric layer, wherein the interface layer covers the semiconductor patterns, wherein the high-k dielectric layer is disposed on the interface layer, wherein a thickness of the lower dielectric pattern is greater than a thickness of the interface layer, and wherein a bottommost portion of the source/drain pattern is at a level lower than a lower surface of the lower dielectric pattern.

2. The semiconductor device of claim 1, wherein the lower dielectric pattern includes silicon-germanium oxide (SiGeOx).

3. The semiconductor device of claim 2, wherein a germanium concentration of the silicon-germanium oxide is in a range of about 3 at % to about 15 at %.

4. The semiconductor device of claim 2, wherein the lower dielectric pattern further includes carbon (C).

5. The semiconductor device of claim 1, wherein the thickness of the interface layer is in a range of about 5 Å to about 8 Å, and the thickness of the lower dielectric pattern is in a range of about 12 Å to about 30 Å.

6. The semiconductor device of claim 1, wherein the lower dielectric pattern overlaps with the source/drain pattern.

7. The semiconductor device of claim 1, wherein a width in a second direction of the lower dielectric pattern is greater than a width in the second direction of the interface layer, wherein the second direction being different from the first direction.

8. The semiconductor device of claim 1, wherein the interface layer includes at least one of a silicon oxide layer or a silicon oxynitride layer, and the high-k dielectric layer and the lower dielectric pattern are spaced apart from each other in a vertical direction by the interface layer.

9. The semiconductor device of claim 1, wherein the lower dielectric pattern is interposed between the gate electrode and a plurality of active patterns spaced apart from each other by the device isolation layer, and terminates between the active patterns without extending across the device isolation layer.

10. The semiconductor device of claim 1, wherein the silicon-germanium pattern is in contact with the source/drain pattern.

11. The semiconductor device of claim 1, wherein the source/drain pattern includes a protrusion that protrudes toward the gate electrode, and a lateral surface of the source/drain pattern has an uneven surface.

12. A semiconductor device, comprising:

a substrate that includes an active pattern;

a channel pattern disposed on the active pattern, wherein the channel pattern includes a plurality of semiconductor patterns that are stacked on each other and spaced apart from each other;

a source/drain pattern connected to the plurality of semiconductor patterns;

a gate electrode that covers the plurality of semiconductor patterns;

a gate dielectric layer disposed between the plurality of semiconductor patterns and the gate electrode;

a lower dielectric pattern disposed between the active pattern and the gate electrode; and a silicon-germanium (SiGe) pattern disposed between a sidewall of the source/drain pattern and a sidewall of the lower dielectric pattern, wherein the silicon-germanium pattern is at a level substantially the same as a level of the lower dielectric pattern, wherein the gate dielectric layer covers at least a portion of a top surface of the lower dielectric pattern, wherein the lower dielectric pattern and the gate electrode are spaced apart from each other with the gate dielectric layer disposed therebetween, and wherein a bottommost portion of the source/drain pattern is at a level lower than a lower surface of the lower dielectric pattern.

13. The semiconductor device of claim 12, wherein the lower dielectric pattern includes silicon-germanium oxide (SiGeOx), and a germanium concentration of the silicon-germanium oxide is in a range of about 3 at % to about 15 at %.

14. The semiconductor device of claim 12, wherein the gate dielectric layer includes an interface layer and a high-k dielectric layer, wherein the interface layer covers the plurality of semiconductor patterns, and the high-k dielectric layer is disposed on the interface layer, and wherein the lower dielectric pattern overlaps the high-k dielectric layer.

15. The semiconductor device of claim 12, wherein the lower dielectric pattern overlaps in a vertical direction with the channel pattern, and does not overlap in a horizontal direction with the channel pattern.

16. The semiconductor device of claim 12, wherein a width in a first direction of the lower dielectric pattern is greater than a width in the first direction of the gate electrode.

17. A semiconductor device, comprising:

a substrate that includes an active region;

a device isolation layer that defines an active pattern on the active region;

a lower dielectric pattern disposed on the active pattern;

a channel pattern disposed on the lower dielectric pattern;

a source/drain pattern disposed on a first surface of the channel pattern, wherein the source/drain pattern penetrates the lower dielectric pattern;

a silicon-germanium (SiGe) pattern disposed between a sidewall of the source/drain pattern and a sidewall of the lower dielectric pattern;

a gate electrode disposed on the channel pattern;

a gate dielectric layer disposed between the gate electrode and the channel pattern;

a gate spacer disposed on a sidewall of the gate electrode;

a gate capping pattern disposed on the gate electrode;

an interlayer dielectric layer disposed on the gate capping pattern;

an active contact that penetrates the interlayer dielectric layer and is electrically connected with the source/drain pattern;

a metal-semiconductor compound layer disposed between the active contact and the source/drain pattern;

a gate contact that penetrates the interlayer dielectric layer and the gate capping pattern and is electrically connected with the gate electrode;

a first metal layer disposed on the interlayer dielectric layer, wherein the first metal layer includes a power line and first wiring lines, wherein the first wiring lines are correspondingly electrically connected to the active contact and the gate contact; and a second metal layer disposed on the first metal layer, wherein the silicon-germanium pattern is at a level substantially the same as a level of the lower dielectric pattern, wherein the second metal layer includes second wiring lines electrically connected to the first metal layer, wherein the channel pattern includes a plurality of semiconductor patterns that are stacked in a second direction substantially perpendicular to a top surface of the substrate, wherein the gate dielectric layer includes an interface layer and a high-k dielectric layer, wherein the interface layer covers the semiconductor patterns, and the high-k dielectric layer is disposed on the interface layer, wherein the lower dielectric pattern and the interface layer include different materials from each other, and wherein a bottommost portion of the source/drain pattern is at a level lower than a lower surface of the lower dielectric pattern.

18. The semiconductor device of claim 17, wherein the interface layer includes at least one of a silicon oxide layer or a silicon oxynitride layer, the lower dielectric pattern includes silicon-germanium oxide (SiGeOx), and a germanium concentration of the silicon-germanium oxide is in a range of about 3 at % to about 15 at %.

19. The semiconductor device of claim 18, wherein the active pattern and the gate dielectric layer are spaced apart in a vertical direction from each other with the lower dielectric pattern disposed therebetween.

20. The semiconductor device of claim 17, wherein an uppermost surface of the lower dielectric pattern is at a level lower than a level of a lowermost surface of the gate electrode.

* * * * *